United States Patent
Zinevich

(10) Patent No.: US 10,333,616 B1
(45) Date of Patent: Jun. 25, 2019

(54) DETECTING BURST PIM IN DOWNSTREAM AT DROP

(71) Applicant: ARCOM DIGITAL, LLC, Syracuse, NY (US)

(72) Inventor: Victor M. Zinevich, Vorenezh (RU)

(73) Assignee: ARCOM DIGITAL, LLC, Syracuse, NY (US)

(*) Notice: Subject to any disclaimer, the term of this patent is extended or adjusted under 35 U.S.C. 154(b) by 0 days.

(21) Appl. No.: 16/125,824

(22) Filed: Sep. 10, 2018

Related U.S. Application Data

(60) Provisional application No. 62/618,246, filed on Jan. 17, 2018, provisional application No. 62/632,109, filed on Feb. 19, 2018.

(51) Int. Cl.
    *H04B 10/00* (2013.01)
    *H04B 10/079* (2013.01)
    (Continued)

(52) U.S. Cl.
    CPC ..... *H04B 10/0795* (2013.01); *H04B 10/2507* (2013.01); *H04B 10/25751* (2013.01)

(58) Field of Classification Search
    CPC .......... H04B 10/2575; H04B 10/25751; H04N 21/60; H04N 21/61; H04N 21/6118; H04N 21/6168
    See application file for complete search history.

(56) References Cited

U.S. PATENT DOCUMENTS

| 6,070,091 A | 5/2000 | Hogevik |
| 6,144,692 A | 11/2000 | Beck |

(Continued)

FOREIGN PATENT DOCUMENTS

| WO | WO2012009757 A1 | 1/2012 |
| WO | WO2012126056 A1 | 9/2012 |

OTHER PUBLICATIONS

Cable Television Laboratories, Inc. (CABLELABS®), entitled "Data-Over-Cable Service Interface Specifications, DOCSIS® 3.1, Physical Layer Specification, CM-SP-PHYv3.1-I13-171220," Dec. 20, 2017, pp. 25, 40, 200-210, 264-270, CABLELABS®, Louisville, CO.
Cable Television Laboratories, Inc. (CABLELABS®), entitled "Data-Over-Cable Service Interface Specifications, DOCSIS® 3.0, Physical Layer Specification, CM-SP-PHYv3.0-001-171207," Dec. 7, 2017, pp. 11-184 (pp. 31 & 111), CABLELABS®, Louisville, CO.
Ariesen, Jan (CTO of Technetix, Inc.), "Upstream Challenges With DOCSIS 3.1," Oct. 17, 2017, pp. 4-9, SCTE/ISBE and NTCA (https://www.nctatechnicalpapers.com/paper/2017).

(Continued)

*Primary Examiner* — Daniel G Dobson
(74) *Attorney, Agent, or Firm* — Lawrence P. Trapani, Esq.

(57) ABSTRACT

Detecting PIM in a downstream signal, wherein the downstream signal is received from a cable plant via a subscriber network and an upstream signal is transmitted to the cable plant via the subscriber network. The upstream signal is transmitted in bursts during active intervals. PIM arises from an interaction between the upstream signal and a nonlinear component in the subscriber network and occurs in bursts corresponding to the upstream signal. The detection steps are: (a) identifying the potentially affected downstream signal from the upstream signal; (b) receiving the downstream signal during an active interval; (c) measuring a metric of the downstream signal to obtain an active value; (d) receiving the downstream signal during a quiet interval; (e) measuring the metric of the downstream signal to obtain a quiet value; (f) comparing active and quiet values; and (g) determining whether PIM distortion has been detected based on the comparison.

44 Claims, 14 Drawing Sheets

(51) Int. Cl.
*H04B 10/2507* (2013.01)
*H04B 10/2575* (2013.01)
*H04J 14/00* (2006.01)

(56) References Cited

U.S. PATENT DOCUMENTS

| | | | |
|---|---|---|---|
| 6,425,132 | B1 | 7/2002 | Chappell |
| 6,895,043 | B1 | 5/2005 | Naegeli et al. |
| 6,934,655 | B2 | 8/2005 | Jones et al. |
| 7,024,680 | B2 | 4/2006 | Howard |
| 7,415,367 | B2 | 8/2008 | Williams |
| 7,584,496 | B2 | 9/2009 | Zinevich |
| 7,788,050 | B2 | 8/2010 | Williams |
| 8,032,102 | B2 | 10/2011 | Molnar et al. |
| 8,054,088 | B2 | 11/2011 | Delforce et al. |
| 8,058,880 | B2 | 11/2011 | Bradley et al. |
| 8,294,469 | B2 | 10/2012 | Bradley et al. |
| 8,311,086 | B2 | 11/2012 | Miller et al. |
| 8,345,737 | B2 | 1/2013 | Cooprider et al. |
| 8,369,812 | B2 | 2/2013 | Lehman |
| 8,548,760 | B2 | 10/2013 | Chappell |
| 8,649,421 | B2 | 2/2014 | Renken et al. |
| 8,879,669 | B2 | 11/2014 | Massey |
| 9,100,339 | B1 | 8/2015 | Hamzeh |
| 9,203,664 | B2 | 12/2015 | Currivan et al. |
| 9,209,863 | B2 | 12/2015 | Williams et al. |
| 9,225,387 | B2 | 12/2015 | Williams et al. |
| 9,264,101 | B2 | 2/2016 | Currivan et al. |
| 9,531,562 | B2 | 12/2016 | Currivan et al. |
| 9,634,722 | B2 | 4/2017 | Gray et al. |
| 9,826,263 | B2 | 11/2017 | Zinevich |
| 2002/0094785 | A1 | 7/2002 | Deats |
| 2003/0040277 | A1 | 2/2003 | Deats |
| 2008/0039045 | A1 | 2/2008 | Filipovic et al. |
| 2009/0125253 | A1 | 5/2009 | Blair et al. |
| 2011/0224923 | A1 | 9/2011 | Blair et al. |
| 2012/0155307 | A1 | 6/2012 | Turk et al. |
| 2014/0294052 | A1 | 10/2014 | Currivan et al. |
| 2015/0020128 | A1 | 1/2015 | Maxson et al. |
| 2015/0078194 | A1 | 3/2015 | Currivan et al. |
| 2016/0028496 | A1 | 1/2016 | Currivan et al. |
| 2016/0112214 | A1 | 4/2016 | Currivan et al. |
| 2016/0112734 | A1 | 4/2016 | Williams et al. |
| 2016/0315706 | A1* | 10/2016 | Yeo ............... H04B 10/25753 |
| 2017/0063478 | A1 | 3/2017 | Flask |
| 2017/0222740 | A1* | 8/2017 | You ............... H04B 17/16 |
| 2018/0138995 | A1* | 5/2018 | Kang ............... H04B 17/345 |
| 2018/0332487 | A1* | 11/2018 | Beck ............... H04B 17/27 |

OTHER PUBLICATIONS

VeEX, Incorporated, VePal CX380s-D3.1 "Advanced All-In-One Installer Meter (User Manual)," Oct. 13, 2016, pp. 7 & 9-93 (p. 40), VeEX Incorporated, Santa Clara, CA.
Cable Television Laboratories, Inc. (CABLELABS®), entitled "DOCSIS® Best Practices and Guidelines, PNM Best Practices: HFC Networks (DOCSIS 3.0), CM-GL-PNMP-V03-160725," Jul. 25, 2016, pp. 15, 30, 106-114, 116-137 (Appendix I-9), CABLELABS®, Louisville, CO http://www.cablelabs.corn/specification/proactive-network-maintenance-using-pre-equalization/.
Tresness, Gregory, A New Discussion Regarding Drop Related Impairments—PIM, ARCOM Whitepaper, Jun. 2016, pp. 2-18 (p. 10), ARCOM Digital, LLC, Syracuse, NY.
Campos, Alberto, Andreoli-Fang, Jennifer & Ganti, Vivek, Cable Network Management Infrastructure Evolution, Apr. 2014, pp. 1-19, Cable Television Laboratories, Inc. (Cablelabs®), Louisville, CO.
Damm, Wofgang, Passive Intermodulation, Jan. 2014, pp. 9-49, AWT Global (Advanced Wireless Technology), Hackettstown, NJ.
KAELUS, Kaelus Launches Next Generation PIM Test Analyzer, Feb. 2013, p. 1, Kaelus (Smiths Interconnect), Centennial, CO.
Campos, Alberto, Hamzeh, Belal & Williams, Thomas, Testing for Nonlinear Distortion in Cable Networks, Oct. 2013, pp. 4-16, Cable Television Laboratories, Inc. (Cablelabs®), Louisville, CO.
Williams, Thomas, Hamzeh, Belal & Hranac, Ron, Field Measurements of Nonlinear Distortion in Digital Cable Plants, Jan. 2013, pp. 1-10, Cable Television Laboratories, Inc. (Cablelabs®), Louisville, CO and Cisco Systems, San Jose, CA.
Hranac, Ron, Making MER Better: Part 2, SCTE Technical Columns, Communications Technology Magazine, Sep. 2009, pp. 1-3, SCTE, https://www.scte.org/TechnicalColumns/09-09-01%20making%20mer%20better%20part%20two.pdf.
Hranac, Ron, Making MER Better: Part 1, SCTE Technical Columns, Communications Technology Magazine, Aug. 2009, pp. 1-3, SCTE https://www.scte.org/TechnicalColumns/09-08-01%20making%20mer%20better%20part%20one.pdf.
Patel, Bharat (Barry), Report on Common Path Distortions or Characterization of Common Path Distortions, dated Feb. 3, 1998, pp. 1-2, 5-9, 16-18, 22-23, 27-28; SCTE.
European Patent Office, International Search Report (ISR) on counterpart PCT Application No. PCT/US2019/013366, filed Jan. 11, 2019, entitled Detecting Burst PIM in Downstream at Drop; date of ISR Apr. 16, 2019, pp. 1-5, published by World Intellectual Property Organization (WIPO), Geneva, Switzerland.
European Patent Office, Written Opinion of International Searching Authority, on counterpart PCT Application No. PCT US2019/013366, filed Jan. 11, 2019, entitled Detecting Burst PIM in Downstream at Drop; date of Written Opinion, Apr. 16, 2019, pp. 1-7, published by World Intellectual Property Organization (WIPO), Geneva, Switzerland.
First Document cited in Int'l. Search Report ("D1"): Cable Television Laboratories, Inc. (CableLabs®), entitled "Data-Over-Cable Service Interface Specifications, DOCSIS® 3.1, Physical Layer Specification, CM-SP-PHYv3.1-I13-171220," Dec. 20, 2017, pp. 21, 27, 200-210, CableLabs®, Louisville, CO (#XP055578309).
Second Document cited in Int'l. Search Report ("D2"): DVB, Digital Video Broadcasting (DVB Organization); Network Failure Detection and Prediction using DOCSIS 3.1 Pilot Measurements; Invention Disclosure # 60562,/1-908; the whole document; Apr. 8, 2014; Digital Video Broadcasting, C/O EBU, 17A Ancienne Route - CH-1218 Grand, Saconnex, Geneva, Switzerland; (#XP017848883).

* cited by examiner

DETECTING BURST PIM IN DOWNSTREAM AT DROP

CROSS-REFERENCE TO RELATED APPLICATIONS

This application claims the benefit of: U.S. Provisional Application No. 62/618,246, filed Jan. 17, 2018, which is incorporated herein by reference; and U.S. Provisional Application No. 62/632,109, filed Feb. 19, 2018, which is incorporated herein by reference. This application is related in subject matter to co-pending application Ser. No. 15/795,362, filed Oct. 27, 2017, naming the same inventor, which is incorporated herein by reference.

BACKGROUND OF THE INVENTION

Field of Invention

The present invention relates generally to detection of impairments in a bi-directional cable television or hybrid-fiber coax (HFC) communication network carrying upstream and downstream signals, and more particularly to methods of detecting passive intermodulation (PIM) distortion in downstream signals caused by upstream burst signals interacting with passive nonlinear components at the subscriber drop.

Background Art

Passive intermodulation (PIM) distortion are noise signals generated by the mixing of frequencies of signals to produce different frequencies (intermodulation products), occurring at passive components (exhibiting nonlinear behavior) in a network. Such passive components may include connectors, splitters, ground blocks, taps, cables, antennas, etc. Typically, the nonlinear behavior of such passive components is caused by metal oxidation (or corrosion). Corrosion on these components produces a so-called "diode effect" on signals contacting these components, thus causing the mixing of the signals. Passive components may also exhibit nonlinear behavior from other mechanisms, such as, e.g., ferrite materials, oil films and other contaminants, thin insulators, mutual contact of different metals, or actual diodes elements. A further explanation of the causes of PIM from passive components (in context of "common path distortion") is found in an article by Bharat (Barry) Patel, entitled, "Common Path Distortions Explained," dated Feb. 3, 1998, pp. 1-29. Herein, passive components exhibiting nonlinear behavior (or a nonlinear response) are sometimes referred to as "nonlinear components," "sources of PIM," or "PIM sources." As discussed, these terms are not limited to components exhibiting nonlinear responses due to corrosion, but include components that exhibit nonlinear behavior because of any other mechanism. PIM distortion presents itself as interference or noise in a receiver or receive band. PIM distortion are signals sometimes called intermodulation products, because they are the product of mixed signals (frequencies) at a nonlinear component.

Cable television networks are bi-directional communication networks that carry upstream signals in an upstream frequency band and downstream signals in a downstream frequency band. In such networks, PIM distortion is referred to as "common path distortion" (CPD) if the distortion occurs in the upstream frequency band (potentially impacting upstream signals) and originates from downstream signals interacting with nonlinear components in the network. The upstream signals are potentially impacted by the downstream signals (i.e., intermodulation products of the downstream signals), because both upstream and downstream signals travel along a common path (i.e., the same cable)—thus the name, common path distortion. In many cases, significant CPD (i.e., impacting performance) is produced along the trunk line of the cable plant (e.g., at connector interfaces), where downstream signal levels are at a maximum and upstream signal levels are at a minimum. A severe example of this is when a nonlinear component is located at the downstream output of a trunk line amplifier, where the downstream signal has just been amplified. At this location, the downstream signal level is typically 45 dBmV, the upstream signal level is typically 15 dBmV, and the CPD level is likely to be about −25 dB relative to the upstream signal level (a level which could affect performance). A further discussion of CPD in cable television networks is found in a document published by Cable Television Laboratories, Inc., Louisville, Colo. (CableLabs), entitled "DOCSIS® Best Practices and Guidelines, PNM Best Practices: HFC Networks (DOCSIS 3.0)," CM-GL-PNMP-V03-160725, Jul. 25, 2016, pp. 106-114 & 116-117, http://www.cablelabs.com/specification/proactive-network-maintenance-using-pre-equalization/(hereinafter "PNM Best Practices"), which is incorporated herein by reference.

The above "trunk line" scenario is contrasted with one at the subscriber network. The subscriber network (or drop network or subscriber drop) is the entire physical communication path from a subscriber tap to and including a subscriber's cable modem (CM), television (TV) or set-top-box (STB). For example, the subscriber network may include: the tap connector, the drop cable from the tap connector to the ground block, the ground block, subscriber cabling from the ground block to an amplifier, the amplifier, cabling from the amplifier to a splitter or splitters, the splitter or splitters, subscriber cabling from the splitter/splitters to a CM, TV or STB, and the CM, TV or STB. In the subscriber network, the downstream signal level is usually at its lowest value (e.g., tens of dB lower than at trunk level, e.g., 0 dBmV), while the upstream signal level (e.g., established by the cable modem) is usually at its highest value (tens of dB higher than at trunk level, e.g., above 50 dBmV). Thus, it is unlikely that CPD (i.e., PIM generated in the upstream from downstream signals) will impact the upstream signals at the subscriber network (see illustration in FIG. 2). On the other hand, the higher level upstream signals (e.g., transmitted by the cable modem) are likely to cause PIM in the downstream frequency band, impacting the lower level downstream signals (again, see FIG. 2). The impairment will now be referred to as PIM, because it is located in the downstream. PIM sources are likely to be present in the subscriber network because of the relatively poor quality of passive components used and the length of time (e.g., many years) such components remain in such networks (ground blocks, splitters, F-connectors etc.).

The potential for PIM to impact performance in the subscriber network is becoming greater as cable television networks migrate to a new industry specification called the Data-Over-Cable Service Interface Specifications 3.1 (DOCSIS® 3.1). This is so because the DOCSIS 3.1 bandwidth of the upstream spectrum will be increased from 42 MHz to up to 204 MHz in mid-split networks and up to 684 MHz in Full Duplex (FDX) networks. In addition, the total power of upstream signals transmitted by the cable modem will increase up to 65 dBmV. Under these conditions, PIM in the subscriber network could significantly impact the downstream channels. This looming problem was recognized in a recent technical paper by Jan Ariesen, CTO, Technetix, Inc., entitled, "Upstream Challenges With DOCSIS 3.1," Oct. 17, 2017, pp. 4-9, SCTE/ISBE and NTCA, (https://www.nctatechnicalpapers.com/paper/2017). This paper describes test results showing a signal-to-noise ratio (SNR) of only 20 dBc in downstream QAM signals, due to PIM distortion in the subscriber network. Thus, there is a growing need for an effective and practical solution to early detection of PIM in subscriber drops of modern cable television networks.

Methods of detection and location of PIM or CPD are well-known for both wireless and wired communication networks. One known approach utilizes a test signal (e.g., two CW tones or a chirp signal) injected into the network under test. See, for example, U.S. Pat. No. 7,788,050 to Williams and U.S. Pat. No. 7,584,496 to Zinevich, for wired networks. Another approach is to utilize existing network traffic signals (e.g., QAM signals) for detection of second and third order PIM. See, e.g., U.S. Pat. No. 9,826,263 to Zinevich; U.S. Pat. No. 7,584,496 to Zinevich; and U.S. Pat. No. 7,415,367 to Williams. Either approach may involve the use of a special-purpose field meter, to be connected to a test port in the network. One commercially available field meter is called the Quiver®, supplied by Arcom Digital, LLC, Syracuse, N.Y. (www.arcomdigital.com/quiver/). A further discussion of CPD detection methods is found in the previously cited document, PNM Best Practices, at pp. 111-114 and in the Background section of U.S. Pat. No. 9,826,263 to Zinevich. At the subscriber network, CPD detection methods usually involve a temporary interruption of service to the subscriber. Such detection methods can be performed during initial installation, an upgrade, or premises certification. However, CPD or PIM is likely to arise at some later time after a visit by the cable company. It is not practical or economical to send technicians to all subscriber locations on a routine basis to test for CPD or PIM. However, routine testing is necessary to detect emerging PIM distortion before it impacts (adversely affects) performance. The latter is a proactive maintenance philosophy, contrasted with a reactive approach where maintenance is performed only after service degrades or fails.

The proactive maintenance philosophy has been adopted in modern cable television networks under the Proactive Network Maintenance (PNM) initiative promulgated by CableLabs in the PNM Best Practices document (full cited above). Modern DOCSIS-based cable television networks contain intelligent DOCSIS-capable devices, such as cable modems (CMs), cable modem termination systems (CMTSs), and digital set-top-boxes (d-STBs), all equipped with sophisticated monitoring tools. These devices can function as network probes for plant monitoring purposes, including collection of performance data about the devices themselves and the network. An analysis of this data, together with knowledge of network topology and device location, makes it possible to isolate the source of a problem before it impacts network performance. PNM primarily relies on DOCSIS upstream pre-equalization coefficients and spectrum capture of upstream and downstream signals. In addition, current metrics being monitored, for example, at the CMs include: CM status; upstream transmit level; downstream receive level; downstream receive modulation error ratio (RxMER); and downstream codeword error ratio (CER) or bit error ratio (BER). The intent of the PNM initiative is to continue expanding capability to include other plant metrics that could help identify and resolve plant issues. (See PNM Best Practices, p. 15.)

PNM implementations have been very successful in detecting linear distortions, impedance mismatches, micro-reflections, group delay, other linear impairments, frequency response issues, tilt, etc. However, in the PNM Best Practices document, one proposal for addressing nonlinear distortion, such as CPD, is to assume or recognize that a nonlinear component may also produce linear distortion, for which PNM techniques are well-suited. Thus, by detecting a linear impairment (e.g., micro-reflections), nonlinear impairments can be addressed, at least indirectly. See PNM Best Practices, pp. 30, 113 & 116. This indirect approach is not optimum because not every nonlinear component will produce a linear distortion or impairment, and little information (level, order, etc.) is obtained about the apparent nonlinear impairment.

Direct PNM approaches to the detection of nonlinear distortions have been developed since first publication of the PNM Best Practices document. For example, engineers at CableLabs have developed methods of capturing downstream and upstream spectrums containing vacant bands for analyzing the presence of nonlinear distortion. Nonlinear distortion is detected by correlating the measured signals (distortion) in the "vacant" band with a manufactured version of the expected nonlinear distortion. In the case of the upstream spectrum, the nonlinear distortion to be detected is created from upstream burst signals. The methods are carried out in a DOCSIS-capable CM or CMTS, consistent with direct PNM monitoring techniques. These methods are further described in: U.S. Pat. No. 9,225,387 to Williams et al.; U.S. Pat. No. 9,209,863 to Williams et al.; Williams et al., "Testing Nonlinear Distortion in Cable Networks, CableLabs, 2013; and Williams et al., "Field Measurements of Nonlinear Distortion in Digital Cable Plants, CableLabs & Cisco Systems, 2013. Other direct PNM methods of detecting nonlinear distortion, utilizing DOCSIS 3.0/3.1—capable CMs and CMTSs, are described in: U.S. Pat. No. 9,826,263 to Zinevich; U.S. Pat. No. 9,634,722 to Gray et al.; U.S. Pat. No. 9,264,101 to Currivan et al.; and U.S. Pat. No. 9,203,664 to Currivan et al. See also earlier work described in U.S. Pat. No. 7,024,680 to Howard and U.S. Pat. No. 6,895,043 to Naegeli et al. These direct approaches are primarily focused on detection of CPD or other nonlinear distortion in the upstream spectrum, due to nonlinear action of signals in the downstream spectrum or upstream spectrum, or to the detection of nonlinear distortion in the downstream spectrum due to nonlinear action of signals in the downstream. However, the problem at hand concerns detecting PIM in the downstream spectrum, caused by strong upstream signals in the subscriber network (interacting with nonlinear components in the subscriber network).

The problem at hand is made even more challenging because the strong upstream signals are burst signals, which cause downstream PIM to occur in bursts, intermittently affecting downstream signals like burst noise (hereinafter "burst PIM"). Further, the PIM problem is local, i.e., it arises in the subscriber network and is experienced at a local CM operating in the subscriber network. A continuous monitoring (PNM) solution should require the local CM to function as a test or monitoring device. Thus, there is a need for a proactive maintenance approach to the detection of downstream burst PIM caused by the interaction of strong upstream burst signals with nonlinear components in the subscriber network.

OBJECTS AND SUMMARY OF THE INVENTION

It is therefore an object of the present invention to provide methods of detecting PIM distortion arising in the subscriber drop of a cable television network that overcome problems associated with the prior art and fulfill the aforesaid need.

It is another object of the present invention to provide methods of detecting PIM distortion arising in the subscriber drop of a cable television network that are performed routinely to identify emerging PIM impairments before service is affected.

It is a further object of the present invention to provide methods of detecting PIM distortion arising in the subscriber drop of a cable television network that do not require interruption of service or a service call to a subscriber.

It is still another object of the present invention to provide methods of detecting burst PIM distortion in a downstream spectrum of a cable television network, caused by burst signals in an upstream spectrum of the cable television network.

It is still a further object of the present invention to provide methods of detecting PIM distortion that are implemented in a cable modem by firmware or software, to achieve a proactive network maintenance solution.

These and other objects are attained in accordance with the present invention, wherein there is provided, in one exemplary embodiment, a first method of using a cable modem in the detection of PIM distortion affecting a downstream signal. The cable modem receives the downstream signal from a cable plant via a subscriber network and transmits an upstream signal to the cable plant via the subscriber network. The upstream signal is transmitted in bursts during active intervals and is not transmitted during quiet intervals. The PIM distortion arises from an interaction between the upstream signal and a nonlinear component in the subscriber network and occurs in bursts that substantially correspond to the transmissions of the upstream signal during the active intervals. This first method comprises the steps of: (a) receiving, at the cable modem, the downstream signal substantially during one of the active intervals, the downstream signal being pre-identified from a relationship between the PIM distortion and the upstream signal; (b) measuring a performance metric of the downstream signal received in step (a), to obtain an active measured value; (c) receiving, at the cable modem, the downstream signal substantially during one of the quiet intervals; (d) measuring the performance metric of the downstream signal received in step (c), to obtain a quiet measured value; (e) comparing the active measured value with the quiet measured value; and (f) determining whether PIM distortion has been detected based on the comparison performed in step (e). In one particular implementation, the downstream signal may be contained within a single downstream channel.

In a modification of the above method, step (e) includes determining a performance difference between the active measured value and the quiet measured value, and step (f) includes comparing the performance difference to a threshold value and determining whether the PIM distortion has been detected based on the comparison to the threshold value. In a further modification, steps (a) through (e) are carried out a plurality of times to obtain a plurality of performance differences, and the method further comprises the step of determining an average difference of the plurality of performance differences. In the latter modification, step (f) includes comparing the average difference to the threshold value, and the determination of whether PIM distortion has been detected is based on the comparison of the average difference to the threshold value. Steps (b) and (d) of the above method may be performed by the cable modem. In a preferred implementation of the method, the performance metric is "receive modulation error ratio" (RxMER). In such case, step (b) includes measuring the RxMER of the downstream signal received in step (a) and step (d) includes measuring the RxMER of the downstream signal received in step (c).

In a more specific version of the first embodiment, there is provided a second method of using a cable modem in the detection of first and second PIM distortion products affecting first and second downstream signals, respectively. The cable modem receives the first and the second downstream signals from a cable plant via a subscriber network and transmits an upstream signal to the cable plant via the subscriber network. The upstream signal is transmitted in bursts during active intervals and is not transmitted during quiet intervals. The first and the second PIM distortion products arise from an interaction between the upstream signal and a nonlinear component in the subscriber network and occur in bursts that substantially correspond to the transmissions of the upstream signal during active intervals. The second method of this embodiment comprises the steps of: (a) receiving, at the cable modem, the first and the second downstream signals substantially during one of the active intervals, the first and the second downstream signals being pre-identified from on a relationship between the first and the second PIM distortion products and the upstream signal; (b) measuring a first performance metric of the first downstream signal received in step (a) to obtain a first active measured value, and measuring a second performance metric of the second downstream signal received in step (a) to obtain a second active measured value; (c) receiving, at the cable modem, the first and the second downstream signals substantially during one of the quiet intervals; (d) measuring the first performance metric of the first downstream signal received in step (c) to obtain a first quiet measured value, and measuring the second performance metric of the second downstream signal received in step (c) to obtain a second quiet measured value; (e) determining a first performance difference between the first active and the first quiet measured values, and determining a second performance difference between the second active and the second quiet measured values; (f) comparing the first performance difference to a first threshold value and the second performance difference to a second threshold value; and (g) determining whether the first and the second PIM distortion products have been detected, based on the comparisons performed in step (f). In one particular implementation, the first and the second downstream signals may be contained within first and second downstream channels, respectively.

In a modification of the above second method, steps (a) through (e) are carried out a plurality of times to obtain a plurality of first performance differences and a plurality of second performance differences. In this modification, the second method further comprises the step of determining a first average difference of the plurality of first performance differences and a second average difference of the plurality of second performance differences. Then, step (f) includes comparing the first average difference to the first threshold value and the second average difference to the second threshold value; and step (g) includes determining whether the first and the second PIM distortion products have been detected, based on the comparisons of the first average difference to the first threshold value and the second average difference to the second threshold value. In an even more specific version of the above, the first PIM distortion product may be of a second order and the second PIM distortion product may be of a third order. In any case, steps (b) and (d) may be performed by the cable modem. In a preferred implementation of the more specific version of the first embodiment, both first and second performance metrics are RxMER. In such case, step (b) includes measuring RxMER of the first and second downstream signals received in step (c), and step (d) includes measuring the RxMER of the first and second downstream signals received in step (c).

In a second exemplary embodiment, there is provided a first method of using a cable modem in the detection of PIM distortion affecting a downstream signal in a downstream band. The cable modem receives the downstream signal from a cable plant via a subscriber network and transmits an upstream signal to the cable plant via the subscriber network. The upstream signal is transmitted in bursts during active intervals and is not transmitted during quiet intervals. The PIM distortion arises from an interaction between the upstream signal and a nonlinear component in the subscriber network and occurs in bursts that substantially correspond to the transmissions of the upstream signal during the active intervals. The downstream signal has a downstream signal spectrum with high and low regions, and the PIM distortion has a PIM spectrum that overlaps at least the low region of the downstream signal spectrum. The downstream band contains a spectrum that includes the downstream signal spectrum and does not include the PIM spectrum during quiet intervals and includes the downstream signal spectrum and the PIM spectrum during active intervals. The first method of the second embodiment comprises the steps of: (a) capturing, at the cable modem, the spectrum of the downstream band a plurality of times to produce a plurality of captured spectrums, where the plurality of captured spectrums are captured during some of the active intervals and some of the quiet intervals, the downstream band being pre-identified from on a relationship between the PIM distortion and the upstream signal; (b) generating, at the cable modem, maximum hold and averaged spectrums from the plurality of captured spectrums, where the maximum hold and the averaged spectrums substantially maintain the high and the low regions of the downstream signal spectrum; (c) determining a difference in level between the maximum hold spectrum and the averaged spectrum, at the high and the low regions, to produce a high region difference and a low region difference; and (d) determining whether the PIM distortion has been detected based on a comparison between the high region difference and the low region difference.

The low region of the downstream signal spectrum may be a guard band or roll-off region defined between the spectrums of two adjacent QAM channel signals, and the high region of the downstream signal spectrum is a maximal portion (e.g., top of haystack) of either of the spectrums of the two adjacent QAM channel signals. The low region may also be a vacant or exclusion band of an OFDM signal.

In a more specific version of the first method of the second embodiment, step (d) includes determining that the PIM distortion has been detected if the low region difference is greater than the high region difference, or if the low region difference is greater than the high region difference by a threshold value. In some implementations, the threshold value may be at least about 6 dB.

The first method of the second embodiment may be modified to include the further step of: (e) determining a first "receive carrier-to-noise ratio" (RxCNR) value from high and low signal level values of the maximum hold spectrum, where the high and low signal level values are at the high and low regions (of the maximum hold spectrum), respectively. The first method of the second embodiment may be further modified to include a plurality of other cable modems coupled to the cable plant via a plurality of other subscriber networks, respectively. In this further modification, each of the other cable modems receives the downstream signal from the cable plant and transmits another upstream signal to the cable plant. The other upstream signal is transmitted in bursts during assigned active intervals and is not transmitted during quiet intervals. The other upstream signal has a spectrum that is substantially the same as the spectrum of the initial upstream signal. In this further modification, step (a) is repeated and a maximum hold spectrum generated at each of the other cable modems. This further modification also includes the additional steps of: (f) determining, as in step (e) above, a RxCNR value at each of the other cable modems; and (g) comparing the highest RxCNR value of the other cable modems to the first RxCNR value, to aid in the determination of PIM detection in step (d). Step (g) may further include: determining that the PIM distortion has been detected if the first RxCNR value is less than the highest RxCNR value of the other cable modems, or if the first RxCNR value is less than the highest RxCNR value of the other cable modems by a threshold value. In some cases, the threshold value may be 3 dB, 4 dB, 5 dB or 6 dB.

With respect to the second embodiment, there is provided a second method of using a first cable modem in detecting PIM distortion affecting a downstream signal in a downstream band. The first cable modem receives the downstream signal from a cable plant via a subscriber network and transmits a first upstream signal, in an upstream band, to the cable plant via the subscriber network. The first upstream signal is transmitted in bursts during active intervals and is not transmitted during quiet intervals. The PIM distortion arises from an interaction between the first upstream signal and a nonlinear component in the subscriber network and occurs in bursts that correspond to the transmissions of the first upstream signal during the active intervals. The downstream signal has a downstream signal spectrum with high and low regions, the first upstream signal has a first upstream spectrum, and the PIM distortion has a PIM spectrum that overlaps at least the low region of the downstream signal spectrum. The downstream band contains a spectrum that includes the downstream signal spectrum and does not include the PIM spectrum during quiet intervals and includes the downstream signal spectrum and the PIM spectrum during active intervals. A plurality of other cable modems is coupled to the cable plant via a plurality of other subscriber networks, respectively. Each of the other cable modems receives the downstream signal from the cable plant and transmits to the cable plant, at assigned active intervals, another upstream signal having substantially the first upstream spectrum in the upstream band. Each of the other cable modems does not transmit during quiet periods.

In this second method of the second embodiment, the following steps are performed: (a) capturing, at the first cable modem, the spectrum of the downstream band a plurality of times to produce a plurality of captured spectrums, where the plurality of captured spectrums are captured during some of the active intervals and some of the quiet intervals, the downstream band being pre-identified from a relationship between the PIM spectrum and the first upstream spectrum; (b) generating, at the first cable modem, a maximum hold spectrum from the plurality of captured spectrums, where the maximum hold spectrum substantially maintains the high and the low regions of the downstream signal spectrum and has high and low signal levels at the high and the low regions, respectively; (c) determining a first RxCNR value from the high and the low signal levels of the maximum hold spectrum; (d) repeating steps (a) through (c) for each of the other cable modems to determine a RxCNR value at each of the other cable modems; and (e) comparing the first RxCNR value to the highest RxCNR value determined among the other cable modems, to determine whether the PIM distortion has been detected. In a variation, step (e) may further include the function of determining that PIM distortion has been detected if the first RxCNR value is less than the highest RxCNR value among the other cable modems, or if the first RxCNR value is less than the highest RxCNR value among the other cable modems by a threshold value. In some cases, the threshold value may be 3 dB, 4 dB, 5 dB, or 6 dB.

As described above in connection with one modification, the first and the second methods of the second embodiment may be combined into one method, providing complementary metrics and conditions for PIM detection.

In a third exemplary embodiment, there is provided a first method of determining the presence of a nonlinear component in a subscriber network coupled between a cable plant and a cable modem. The cable modem receives a downstream signal, in a downstream band, from the cable plant via the subscriber network. The downstream signal has a downstream signal spectrum characterized by high and low regions. The third embodiment comprises the steps of: (a) operating the cable modem to transmit a first narrowband signal having a first center frequency in an upstream band, where the first center frequency is selected to produce a first PIM distortion product of the first narrowband signal substantially within the low region of the downstream signal spectrum; (b) transmitting, during active intervals, the first narrowband signal to the cable plant, via the subscriber network, to generate the first PIM distortion product from an interaction between the first narrowband signal and the nonlinear component in the subscriber network, where the downstream band contains a spectrum that includes the downstream signal spectrum and a spectrum of the first PIM product during the active intervals and includes the downstream signal spectrum and does not include the spectrum of the first PIM product during periods when the first narrowband signal is not transmitted; (c) capturing, at the cable modem, the spectrum of the downstream band a plurality of times to produce a plurality of captured spectrums; (d) generating, at the cable modem, a maximum hold spectrum from the plurality of captured spectrums, where the maximum hold spectrum substantially maintains the high and the low regions of the downstream signal spectrum and has high and low levels at the high and the low regions, respectively; (e) determining a value of a first performance metric from the high and the low levels of the maximum hold spectrum; and (f) comparing the value of the first performance metric to a first threshold value, to determine whether the first PIM distortion product has been detected and whether the nonlinear component is present in the subscriber network. It is preferred that the first performance metric be "receive carrier-to-noise ratio" (RxCNR).

The downstream signal may include a downstream channel signal and the low region of the downstream signal spectrum may be a guard band or roll-off region associated with the downstream channel signal. The downstream signal may include a pair of adjacent downstream channel signals and the low region of the downstream signal spectrum may be a guard band or roll-off region between the pair of adjacent downstream channel signals. In connection with step (f) of the first method of the third embodiment, the first threshold value may be based on the highest RxCNR value determined among a plurality of other cable modems coupled to the cable plant via a plurality of other subscriber networks, respectively. The first narrowband signal may be a continuous wave (CW) signal having a single frequency. In the latter case, the first PIM distortion product may be a harmonic of the CW signal, where the frequency of the harmonic is a multiple of the single frequency of the CW signal.

The downstream signal spectrum may further include a second high region and a second low region (e.g., another guard band/roll-off region). In such case, the first center frequency of the first narrowband signal may be selected to produce a second PIM distortion product of the first narrowband signal substantially within the second low region of the downstream signal spectrum. In step (b) of the first method, the second PIM distortion product is generated from an interaction between the first narrowband signal and the nonlinear component in the subscriber network. The spectrum of the downstream band includes the downstream signal spectrum, the spectrum of the first PIM distortion product, and a spectrum of the second PIM distortion product during the active intervals. The spectrum includes the downstream signal spectrum and does not include the spectrums of the first and the second PIM distortion products during periods when the first narrowband signal is not transmitted. In such case, the maximum hold spectrum substantially maintains the second high and the second low regions of the downstream signal spectrum and has second high and second low levels at the second high and the second low regions, respectively. Further, in this case, step (e) of the first method includes determining a value of a second performance metric (e.g., RxCNR) from the second high and the second low levels of the maximum hold spectrum. And, step (f) includes comparing the value of the second performance metric to a second threshold value, to determine whether the second PIM distortion product has been detected and whether the nonlinear component is present in the subscriber network. Again, the first narrowband signal may be a CW signal having a single frequency, and, in such case, the first PIM distortion product may be the second harmonic of the CW signal and the second PIM distortion product may be the third harmonic of the CW signal.

Again, the downstream signal spectrum may include a second high region and a second low region. However, in this case, step (a) of the first method includes operating the cable modem to transmit a second narrowband signal with the first narrowband signal. The second narrowband signal has a second center frequency in the upstream band, separate from the first center frequency of the first narrowband signal. The second center frequency is selected to produce a second PIM distortion product of both narrowband signals substantially within the second low region of the downstream signal spectrum. In step (b), the second narrowband signal is transmitted with the first narrowband signal during active intervals. This generates the second PIM distortion product from an interaction between the narrowband signals and the nonlinear component in the subscriber network. The spectrum of the downstream band includes the downstream signal spectrum, the spectrum of the first PIM distortion product, and a spectrum of the second PIM distortion product during the active intervals. The spectrum includes the downstream signal spectrum and does not include the spectrums of the first and the second PIM distortion products during periods when both narrowband signals are not transmitted. In this implementation, the maximum hold spectrum substantially maintains the second high and the second low regions of the downstream signal spectrum and has second high and second low levels at the second high and the second low regions, respectively. Further in this implementation, step (e) of the first method includes determining a value of a second performance metric (e.g., RxCNR) from the second high and second low levels of the maximum hold spectrum. In step (f), the value of the second performance metric is compared to a second threshold value to determine whether the second PIM distortion product has been detected and whether the nonlinear component is present in the subscriber network.

With respect to the third embodiment, a second method is provided for determining the presence of a nonlinear component in a subscriber network coupled between a cable plant and a cable modem. The cable modem receives a downstream signal, in a downstream band, from the cable plant via the subscriber network. The downstream signal has a downstream signal spectrum characterized by high and low regions. This second method comprises the steps of: (a) operating the cable modem to transmit, in an upstream band, first and second narrowband signals having first and second center frequencies, respectively, wherein the first and the second center frequencies are selected to produce a PIM distortion product of both narrowband signals substantially within the low region of the downstream signal spectrum; (b) transmitting, during active intervals, the first and the second narrowband signals to the cable plant, via the subscriber network, to generate the PIM distortion product from an interaction between the narrowband signals and the nonlinear component in the subscriber network, whereby the downstream band contains a spectrum that includes the downstream signal spectrum and a spectrum of the PIM distortion product during the active intervals and includes the downstream signal spectrum and does not include the spectrum of the PIM distortion product during periods when the first and the second narrowband signals are not transmitted; (c) capturing, at the cable modem, the spectrum of the downstream band a plurality of times to produce a plurality of captured spectrums; (d) generating, at the cable modem, a maximum hold spectrum from the plurality of captured spectrums, where the maximum hold spectrum substantially maintains the high and the low regions of the downstream signal spectrum and has high and low levels at the high and the low regions, respectively; (e) determining a value of a performance metric (e.g., RxCNR) from the high and the low levels of the maximum hold spectrum; and (f) comparing the value of the performance metric to a threshold value to determine whether the PIM distortion product has been detected and whether the nonlinear component is present in the subscriber network. It is preferred that the first and second narrowband signals be CW signals (e.g. at F1 & F2). In such case, the PIM distortion product may be a third order product having a frequency equal to, e.g., 2F2-F1.

With respect to the third embodiment, the spectrum captures of the downstream band may be synchronized to the active intervals, so that each spectrum capture contains the downstream signal spectrum and the spectrum of the PIM distortion product or products.

BRIEF DESCRIPTION OF THE DRAWING

Further objects of the invention will become apparent from the following description of exemplary embodiments with reference to the accompanying drawing, in which.

DETAILED DESCRIPTION OF THE PREFERRED EMBODIMENT

Figure 1:
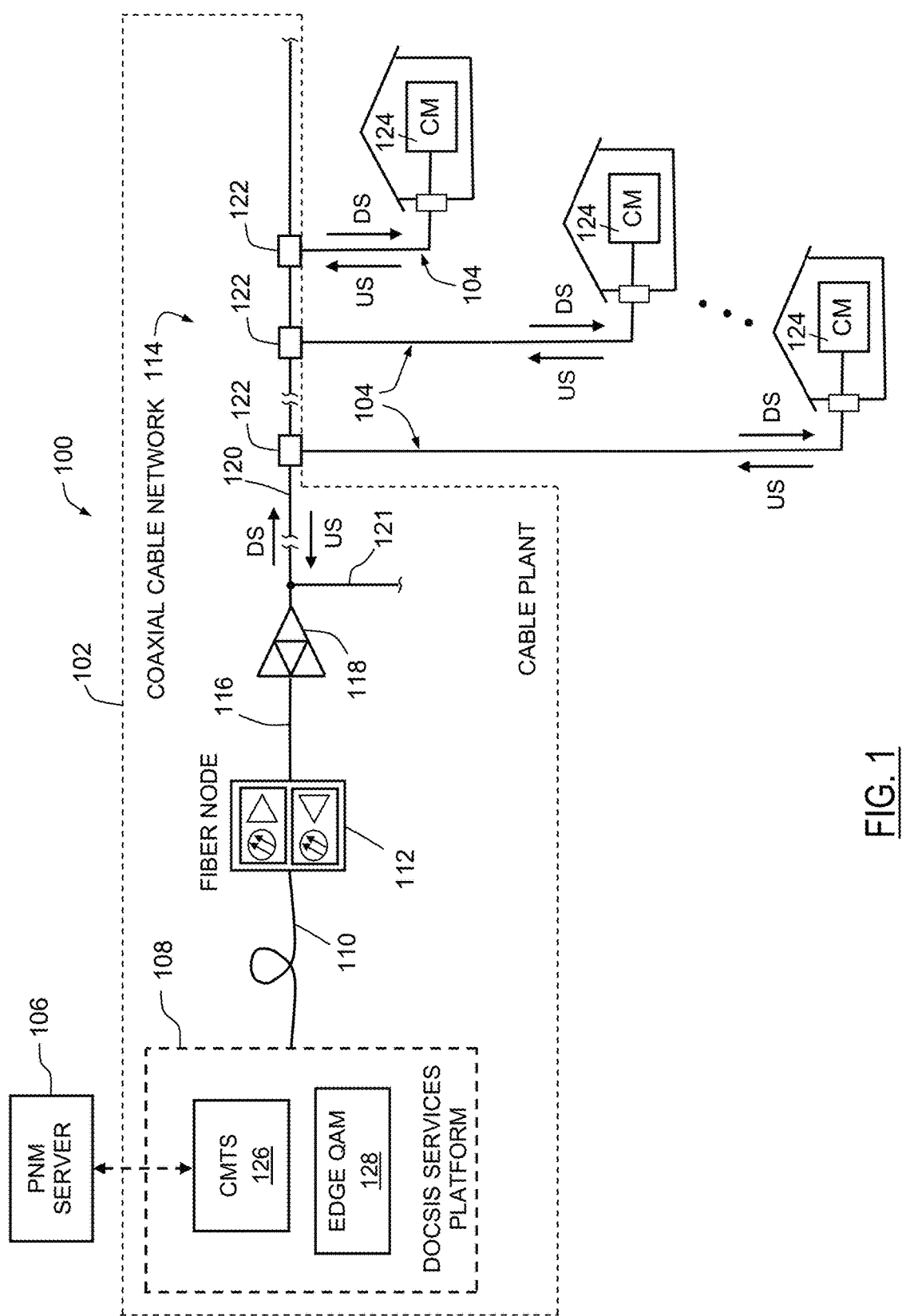
FIG. 1 is a block diagram of a cable television network system, incorporating the invention, comprising a cable plant, a plurality of subscriber networks coupled to the cable plant, and a proactive network maintenance (PNM) server separate from or a part of the cable plant.

FIG. 1 is a block diagram of a cable television network system 100 comprising a cable plant 102, a plurality of subscriber networks 104 coupled to cable plant 102, and a proactive network maintenance (PNM) server 106 communicating with the cable plant 102. System 100 is preferably configured according to the Data-Over-Cable Service Interface Specification (DOCSIS®) version 3.0 or 3.1. See, e.g., the DOCSIS 3.1 Physical Layer Specification, CM-SP-PHYv3.1-I13-171220, by Cable Television Laboratories, Inc. (CableLabs®), dated Dec. 20, 2017 ("DOCSIS 3.1 Specification"), and DOCSIS 3.0 Physical Layer Specification, CM-SP-PHYv3.0-C01-171207, by CableLabs®, dated Dec. 7, 2017 ("DOCSIS 3.0 Specification"), both of which are incorporated herein by reference. Cable plant 102 includes a DOCSIS® services platform 108, a fiber optic cable network 110, a fiber node 112, and a coaxial cable network 114. In this example, coaxial cable network 114 includes a trunk line cable 116, a bi-directional amplifier 118, and two branches 120, 121. Branch 120 includes a number of subscriber taps 122, each having at least one tap connector for connecting to one of subscriber networks 104. Branch 121 has an architecture similar to branch 120.

As indicated in FIG. 1, cable plant 102 carries upstream (US) and downstream (DS) signals. The downstream signals may include quadrature amplitude modulation (QAM) signals and/or orthogonal frequency division multiplexing (OFDM) signals. The upstream signals may include QAM signals and/or orthogonal frequency division multiple access (OFDMA) signals. These upstream and downstream signals are described in the above-cited DOCSIS 3.0 and 3.1 specifications. The downstream signals originate from DOCSIS services platform 108 and the upstream signals original from cable modems (CMs) 124 in subscriber networks 104. Each subscriber network 104 extends from (and includes) the tap connector of tap 122 and continues down to (and includes) CM 124. As shown in FIG. 1, CMs 124 are coupled to cable plant 102 via subscriber networks 104. As indicated in FIG. 1, CMs 124 receive the downstream signals from cable plant 102 and transmit the upstream signals to cable plant 102. Platform 108 includes a cable modem termination system (CMTS) 126 and an edge QAM unit 128. OFDM and QAM downstream signals are transmitted from CMTS 126 and QAM downstream signals are also transmitted from edge QAM unit 128. CMTS 126 may be an integrated CMTS and capable of producing both OFDM and QAM signals. Edge QAM unit 126 may be associated with and function according to a modular CMTS (not shown). In some embodiments, CMTS 126 produces only OFDM downstream signals and edge QAM unit 126 produces the QAM downstream signals. Platform 108 may be situated at a headend, in a hub, or remote from the headend or hub (e.g., at fiber node 112). The downstream signals are converted to downstream optical signals at platform 108 for transmission over fiber optic network 110. The downstream optical signals are then converted to downstream RF electrical signals at fiber node 112, for transmission over coaxial cable network 114. The downstream RF electrical signals are amplified by amplifier 118 and then travel to taps 122 for distribution to subscriber networks 104. The upstream signals are transmitted from CMs 124 as RF electrical signals, and travel through subscriber networks 104, taps 122, and amplifier 118. The upstream signals then travel to fiber node 112, where they are converted to optical signals for transmission through fiber optic network 110. The upstream optical signals are then received by platform 108 and converted to electrical signals for reception, demodulation and decoding by CMTS 126.

PNM server 106 is configured to poll full spectrum capture data from CMs 124, using simple network management protocol (SNMP) communications via cable plant 102. PNM server 106 is also configured to initiate and managed PNM functions at CMs 124 and CMTS 126 and retrieve PNM data from CMs 124 and CMTS 126.

Figure 2:
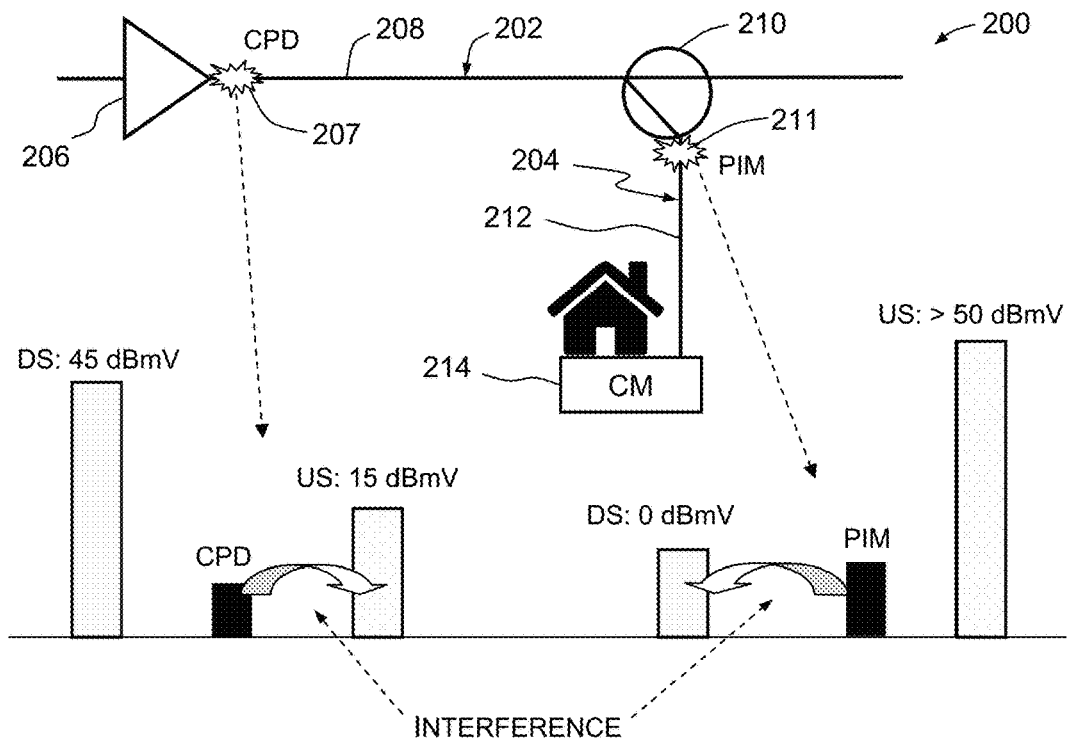
FIG. 2 is a diagram comparing signal level profiles of upstream and downstream signals in both the cable plant and the subscriber network and illustrating different interference scenarios.

Referring now to FIG. 2, the problem of PIM distortion caused in the subscriber network is illustrated. FIG. 2 compares signal level profiles of upstream and downstream signals in both the cable plant and subscriber network. It shows how these signal profiles produce different interference scenarios for the cable plant and the subscriber network. As shown, a cable television network system 200 includes a cable plant 202 and a subscriber network 204. Cable plant 202 includes a bi-directional amplifier 206, a trunk line cable 208, and a subscriber tap 210. Subscriber network 204 includes a drop cable 212 and a CM 214. As indicated earlier, PIM distortion is referred to as "common path distortion" (CPD) if it occurs in the upstream frequency band and originates from downstream signals interacting with CPD sources (i.e., nonlinear components) in the cable plant. In FIG. 2, a CPD source 207 (e.g., connector interface) is located at or near the downstream output of amplifier 206, where the downstream signal level is expected to be at a maximum and the upstream signal level is expected to be low. The downstream signal level is shown (in the chart below) to be 45 dBmV. The signal level of the upstream signal at CPD source 207 is shown (in the chart) to be only 15 dBmV. Under these conditions, CPD (created by interaction of the high level downstream signal with source 207) is likely to interfere with the lower-level upstream signal, as illustrated. In this example, the CPD level may be only 25 dB below the upstream signal level. The CPD may also produce frequencies in the downstream band, but because of the high downstream signal level, interference with the downstream signal is not likely. In subscriber network 204, a PIM source 211 is located at the tap connector of tap 210, where the downstream signal level is expected to be low, but the upstream signal level is expected to be high. The downstream level is shown (chart below) to be 0 dBmV, while the upstream level is shown to be above 50 dBmV. Under these conditions, PIM distortion (created by interaction of the high level upstream signal with source 211) is likely to interfere with the lower-level downstream signal, as illustrated. The PIM interference is experienced in the downstream receiver of CM 214. It is unlikely that CPD will impact the upstream signal here because of the high upstream signal levels. In this subscriber network example, the downstream level of 0 dBmV and upstream level of above 50 dBmV are typical levels measured at CM 214.

Figure 3:
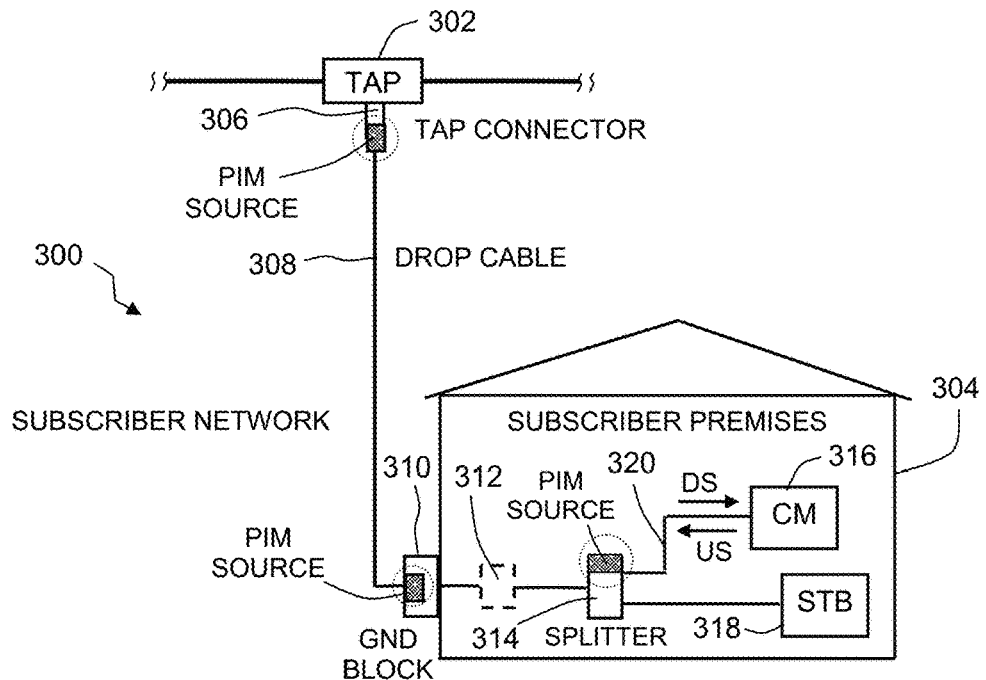
FIG. 3 is a block diagram of a subscriber network, including a subscriber tap connector, drop cable, ground block, subscriber cabling, amplifier (optional), splitter, cable modem, set-top-box, and illustrating likely PIM sources in the network.

Referring now to FIG. 3, an exemplary subscriber network 300 is associated with a subscriber tap 302 and a subscriber premises 304. Subscriber network 300 includes a tap connector 306, a drop cable 308, a ground block 310, an amplifier 312, a splitter 314, a CM 316, STB 318, and subscriber premises cabling 320 (all cabling in premises, from ground block to CM/STB). Possible sources of PIM in network 300 include (but are not limited to): corrosion at tap connector 306, ground block 310, and/or at splitter 314; ferrite materials used in, e.g., splitter 314; metal chips, dust or dirt at connector or contact interfaces; scratches in metal contacts; irregular contact surfaces; dissimilar metals; holes, cracks or frays in cable braids, such as drop cable 308 or subscriber cabling 320; damaged components; resistive components; poorly designed components; and the like. The components, so affected, are referred to as nonlinear components. Network 300 is an example of a subscriber network. The network may be configured in other ways and employ other or additional devices. As indicated in FIG. 3, CM 316 transmits an upstream (US) signal and receives a downstream (DS) signal. The US signal travels up through network 300 to tap 302 and will interact with any or all of the PIM sources, causing PIM distortion in the DS signal as received by CM 316.

Figure 4:
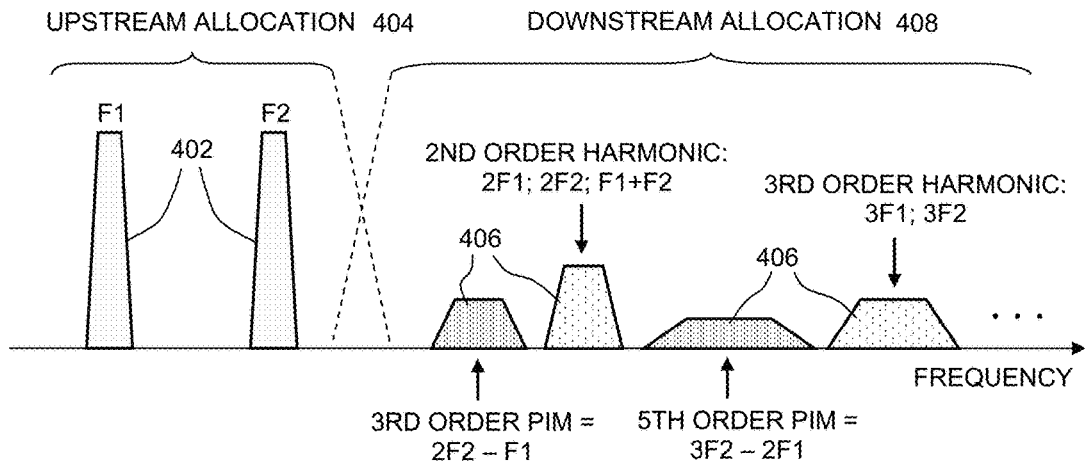
FIG. 4 is a spectrum diagram of upstream and downstream frequency allocations in a cable plant, with a frequency spectrum of an upstream signal in the upstream allocation and frequency spectrums of second, third, and fifth order PIM distortion in the downstream allocation.

FIG. 4 is a spectrum plot of an upstream signal 402 (composite of two signals at F1 & F2) transmitted by a CM in a subscriber network. Signal 402 is located in an upstream frequency allocation 404 of a cable plant. Upstream signal 402 interacts with a PIM source or nonlinear component in the subscriber network to produce PIM distortion 406 at various frequencies in a downstream frequency allocation 408 of the cable plant. PIM distortion 406 includes third and fifth order difference products (2F2-F1 and 3F2-2F1) and second and third order harmonics (2F1, 2F2, F1+F2, 3F1, & 3F2). PIM distortion 406 may interfere with some of the downstream signals (not shown) received by the CM (as the downstream signals are, of course, located in downstream allocation 408). PIM distortion 406 and its frequencies can be determined or at least estimated from a specification of upstream signal 402. A relationship between PIM distortion 406 and upstream signal 402 can be described by the following Taylor series equation:

$$S(t)=A1x(t)+A2x(t)^2+A3x(t)^3+A4x(t)^4+A5x(t)^5\ldots, \quad (1)$$

where S(t) is PIM distortion 406 and x(t) is upstream signal 402. A1, A2, A3, A4 . . . are coefficients, where A1 is the fundamental coefficient or amplitude of upstream signal 402, A2 is a second order distortion coefficient, A3 is a third order distortion coefficient, and A4, etc. are higher order distortion coefficients. The even coefficients A2, A4, etc. correspond to the even order distortion products and the odd coefficients A3, A5, etc. correspond to the odd order distortion products of PIM distortion 406. In equation (1), x(t) is the product of the two signals (centered at F1 and F2) of upstream signal 402. A further discussion of equation (1), and its use in calculating or estimating CPD location, is found in U.S. Pat. No. 9,826,263, which is incorporated herein by reference.

Figure 5:
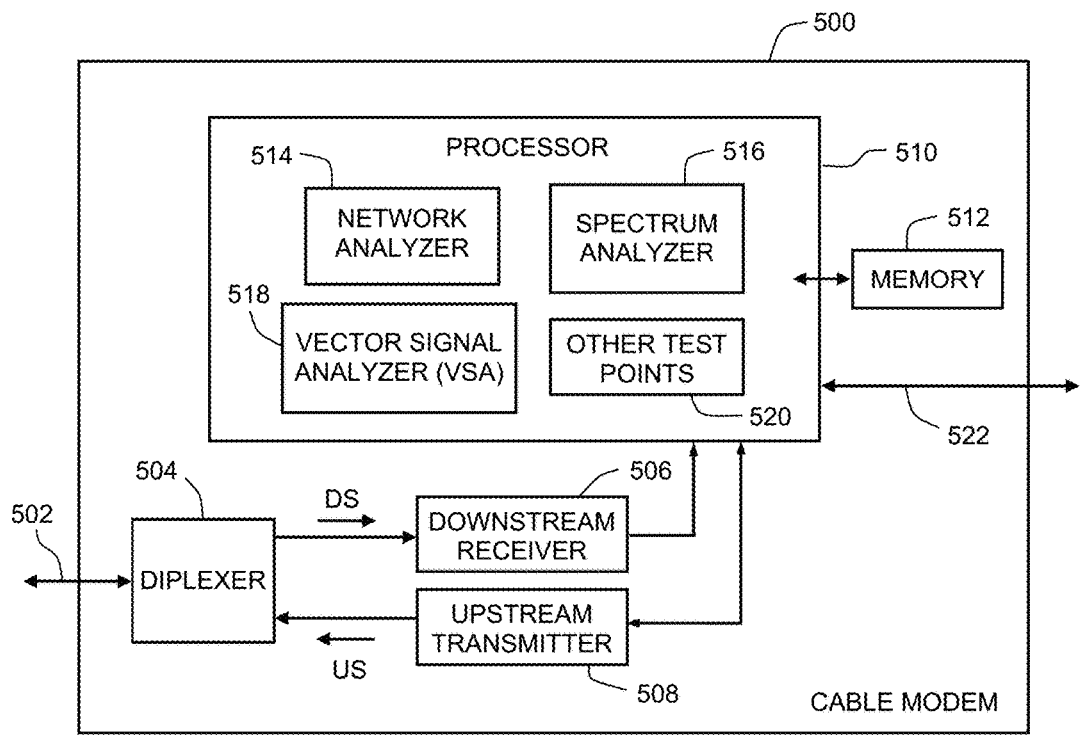
FIG. 5 is a block diagram of a cable modem capable of DOCSIS 3.0 and/or 3.1 communications and PNM functions, and configured to implement the methods of the invention.

Referring now to FIG. 5, a block diagram of a cable modem (CM) 500 is shown. CM 500 is capable of DOCSIS 3.0 and/or 3.1 communications and functions, including PNM functions. CM 500 is also programmed or otherwise configured to implement the methods of the present invention. The structure and operation of a DOCSIS cable modem are well known in the cable television industry and will not be described in detail here. CM 500 has an RF port 502 for receiving downstream signals from and passing upstream signals to a cable plant, via a subscriber network. RF port 502 is connected to a diplexer 504, which is configured in accordance with the upstream and downstream frequency allocations of the cable plant (see FIG. 4). The higher frequency downstream signals are routed through diplexer 504 to a downstream receiver 506. The lower frequency upstream signals, from an upstream transmitter 508, are routed through diplexer 504 to RF port 502. Downstream receiver 506 receives and processes the downstream signals, including filtering, tuning, automatic gain control, demodulation, channel selection, analog-to-digital conversion, decoding, etc. RF and baseband versions of the downstream signal are made available to a processor 510 for spectrum capture, performance measurements, and other analyses and PNM functions. Processor 510 may be configured to perform some or all of the functions of downstream receiver 506. Upstream transmitter 508 prepares upstream data for RF transmission to the cable plant, including encoding, modulating, filtering, digital-to-analog conversion, etc. The RF upstream signal is made available to processor 510 for spectrum capture, performance measurement, and other processes and PNM functions.

Processor 510 is programmed to carryout DOCSIS 3.0 and 3.1 functions and PNM functions. Various programs carrying out DOCSIS and PNM functions may be stored in a memory 512 and/or implemented in firmware in the form of, e.g., a field programmable gate array (FPGA) or as part of a system on a chip (SOC). Memory 512 also stores signal and measurement data associated with DOCSIS and PNM functions, including signal or spectrum captures. Processor 510 may be implemented as an SOC or as multiple chips. Processor 510 is shown implemented with various DOCSIS and PNM functions or modules, including a network analyzer 514, a spectrum analyzer 516, a vector signal analyzer 518, and other test points 520. Network analyzer 514 performs symbol capture of the downstream signal. Spectrum analyzer 516 performs full-band, wide-band or select-band spectrum capture, signal level measurements, and noise power ratio (NPR) measurements of the downstream signal. Spectrum analyzer 516 is capable of performing multiple spectrum captures of the downstream signal and producing therefrom maximum hold (or "Max Hold") and averaged ("AVG") spectrums. Max Hold and AVG spectrums are compiled spectrums. The Max Hold spectrum represents the maximum level (value) from the multiple captures, at each frequency or frequency bin of the spectrum. The AVG spectrum represents the averaged level (value) from the multiple captures, at each frequency or frequency bin of the spectrum. Vector signal analyzer 518 estimates upstream pre-equalizer coefficients, estimates downstream channel response, creates constellation displays, and measures downstream receive modulation error ratio (RxMER) and signal-to-noise ratio (SNR). In some implementations, the downstream RxMER measurement may be carried out by downstream receiver 506, as described in PNM Best Practices, Appendix 1-9 (pp. 134-37). Other test points 520 performs downstream forward error correction (FEC) and downstream histogram analyses. Further details regarding these DOCSIS and PNM functions are found in the DOCSIS 3.1 Specification, Section 9. DOCSIS and PNM functions for a cable modem are also described in U.S. Patent App. Pub. 2016/0028496 and U.S. Pat. No. 9,264,101 to Currivan et al., both of which are incorporated herein by reference.

With further reference to FIG. 5, CM 500 further includes a communication port 522, which accommodates both data and voice communications between processor 510 and other customer premises equipment.

Figure 6:
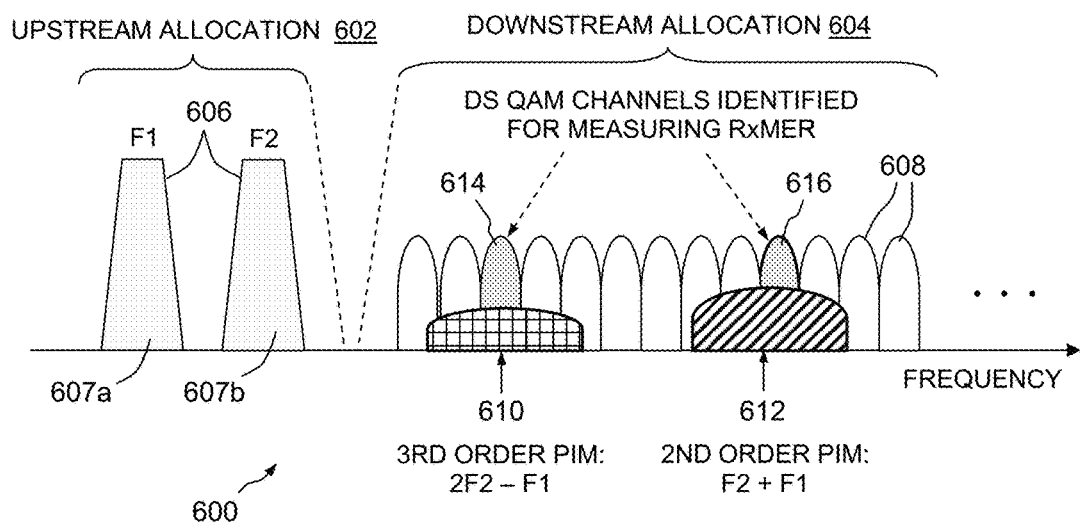
FIG. 6 is a spectrum diagram showing upstream and downstream QAM signals, second and third order PIM distortion among the downstream QAM signals, and selection of specific downstream QAM channels for measuring RxMER.

With reference to FIG. 6, an example of the first embodiment of the present invention will be described. FIG. 6 shows a spectrum 600 of signals divided into an upstream frequency allocation 602 and a downstream frequency allocation 604. An upstream signal 606, in upstream allocation 602, includes two QAM signals 607a and 607b centered at F1 and F2, respectively. A number of downstream QAM signals 608 are organized in contiguous downstream channels in downstream allocation 604 (i.e., QAM channel signals). Upstream signal 606 is transmitted in a subscriber network and interacts with a nonlinear component therein, causing PIM distortion. As discussed previously, PIM distortion can be calculated or estimated in advance using equation (1) or equivalent expressions. Knowing, a priori, the characteristics of upstream signal 606 (e.g., its frequency spectrum), the expected PIM distortion can be determined from equation (1). Equation (1) defines a relationship between the PIM distortion and the upstream signal. As shown in FIG. 6, third order PIM distortion (2F2-F1) 610 and second order PIM distortion (F2+F1) 612 are expected to be prominent distortion products in the downstream allocation. Note, PIM distortion 610 and 612 are located at frequencies that overlapped some of downstream QAM channel signals 608. Once PIM 610 and 612 are determined, particular downstream QAM channel signals for each PIM can be identified (i.e., pre-identified) for measurement of a performance metric concerning the signal. In the FIG. 6 example, downstream (DS) QAM channel signals 614 and 616 were pre-identified for measuring the affects of third and second order PIM 610 and 612, respectively. DS channel signals 614 and 616 were pre-identified for performance measurement because they are at or near the peak of the PIM distortions, and thus are expected to be the worst cases (and where the PIM is easiest to detect). However, the invention is not limited to this selection criterion. Also, two, three or all PIM-overlapped DS QAM channel signals may be selected (at each ordered PIM) for performance measurement. The performance metric to be used is one that will be a good indicator of performance degradation (of the DS channel signals) due to the presence PIM distortion. The preferred performance metric is "receive modulation error ratio" (RxMER) of the selected DS QAM channel signal. Another suitable performance metric may be "received signal-to-noise ratio" (RxSNR).

Figure 7:
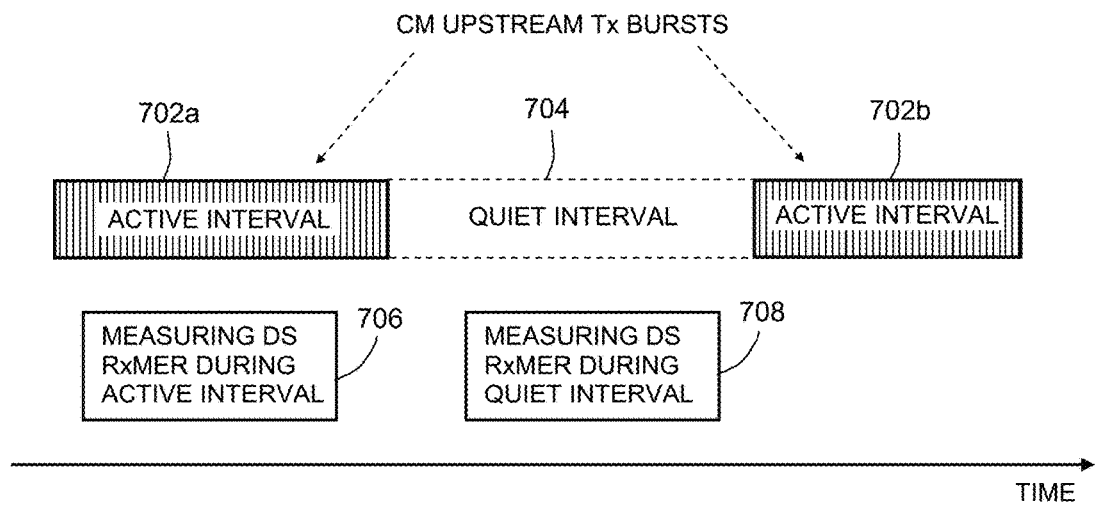
FIG. 7 is a timing diagram of cable modem transmissions of upstream signals in bursts during active intervals and non-transmission of upstream signals during quiet intervals, and illustrating synchronization of measurements of RxMER with the active and quiet intervals.

The discussion of the first embodiment continues with reference to FIGS. 6 & 7. Upstream signal 606 is transmitted in bursts by a CM during assigned "active" time slots or intervals (hereinafter "active intervals") and is not transmitted during "quiet" time slots or periods (hereinafter "quiet intervals"). The CMTS (FIG. 1) associated with the CM communicates an assignment or schedule of active intervals to the CM for burst transmission. This schedule is stored in memory in the CM (e.g., memory 512 in FIG. 5). Burst transmission of upstream signals is further described in the DOCSIS 3.0 & 3.1 Specifications. In FIG. 7, a timing diagram shows two assigned active intervals 702a and 702b separated by a quiet interval 704. Below that, two measurement periods 706 and 708 are shown synchronized with active interval 702a and quiet interval 704, respectively. The performance metric (e.g., RxMER) of DS QAM channel signal 614 is measured during periods 706 and 708. Similarly, the performance metric (e.g., RxMER) of DS QAM channel signal 616 is measured during a similar pair of measurement periods synchronized to active and quiet intervals, respectively.

Figure 8:
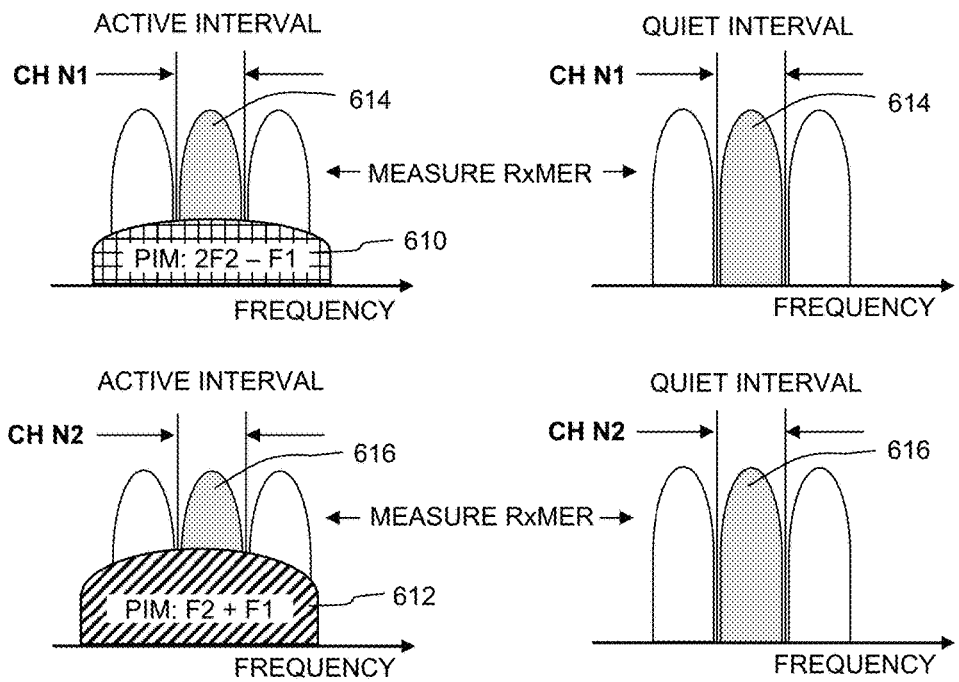
FIG. 8 shows two pairs of spectrum diagrams illustrating, in the upper pair, RxMER measurements, during active and quiet intervals, of downstream Channel N1, affected by third order PIM, and in the lower pair, RxMER measurements, during active and quiet intervals, of downstream Channel N2, affected by second order PIM.

The discussion of the first embodiment continues with reference to FIGS. 6, 7 & 8. FIG. 8 illustrates the performance metric measurement during active and quiet intervals, for both DS QAM channel signals 614 and 616. In FIG. 8, signal 614 is in channel (CH) N1 and signal 616 is in CH N2. As illustrated, RxMER of signal 614 in CH N1 is measured during an active interval (i.e., during a burst transmission of upstream signal 606). Third order PIM distortion 610 impacts signal 614 in CH N1 during the measurement. Thus, the RxMER should reveal some degradation in performance ("active RxMER"). RxMER of signal 614 in CH N1 is then measured during a quiet interval (i.e., when upstream signal 606 is not being transmitted). As shown, PIM distortion 610 is not present in CH N1 during the quiet interval. Thus, the RxMER should not indicate a degradation in performance from PIM 610 ("quiet RxMER"). The difference between active RxMER and quiet RxMER ("delta RxMER") gives an indication of the relative performance degradation due to PIM distortion 610. Depending on the magnitude of delta RxMER, a decision can be made about whether PIM distortion is occurring in CH N1. For example, if delta RxMER is greater than 3 dB, a decision may be made that PIM distortion has been detected in CH N1. Thus, a 3 dB threshold is established for detecting PIM distortion. In other examples, the threshold may be set to 4 dB, 5 dB, or 6 dB. Again referring to FIG. 8, RxMER of signal 616 in CH N2 is measured during an active interval (i.e., during a burst transmission of upstream signal 606). Second order PIM distortion 612 impacts signal 616 in CH N2 during the measurement. RxMER of signal 616 in CH N2 is then measured during a quiet interval (i.e., when upstream signal 606 is not being transmitted). As shown, PIM distortion 612 is not present in CH N2 during the quiet interval. Thus, the RxMER should not indicate a degradation in performance from PIM 612. The delta RxMER for CH N2 gives an indication of relative performance degradation due to PIM distortion 612. Again, depending on the magnitude of delta RxMER, a decision can be made about whether PIM distortion is occurring in CH N2. The same thresholds used for delta RxMER in CH N1 (e.g., 3, 4, 5, or 6 dB) may be employed for CH N2, to indicate PIM detection.

It is now understood that the burst nature of the upstream signal causes a burst nature or behavior of the PIM distortion. This is a characteristic specific to subscriber networks and one which is seized upon by the present invention to detect and validate (or at least assist in detecting and validating) PIM distortion. Delta RxMER not only serves as a basis for concluding that PIM distortion has been detected, but also serves as confirmation that the performance degradation (delta) is likely due to PIM and not some other factor. This is so because the delta is created because of the burst nature of the PIM distortion (present during active interval; not present during quiet interval). Another validation that PIM distortion has been detected is that the delta is occurring in a downstream signal or channel pre-identified to be the location of the PIM.

The first embodiment of the present invention can be performed, at least in part, by CM 500. CM 500 should be programmed or otherwise configured to synchronize the measurement of RxMER (or other performance metric) with the active and quiet intervals. Such programming is straightforward in most DOCSIS 3.0 and 3.1 cable modems. For example, processor 510 of CM 500 could be programmed with only a few instructions to trigger the RxMER measurement with the start of an active interval or upon detection of an actual burst transmission. Knowledge of the duration or frequency of active intervals (time slots) can be used to create a trigger for the RxMER measurement during a quiet interval. The program for processor 510 may then include simple instructions to calculate Delta RxMER for each channel and a SNMP command to "send delta RxMER" to another device such an associated CMTS or a PNM server (for example). Delta RxMER may be calculated at such other device, in which case, CM 500 would execute SNMP commands: "send active RxMER" and "send quiet RxMER." This programming may be implemented in software and/or firmware and/or hardware.

Figure 9A:
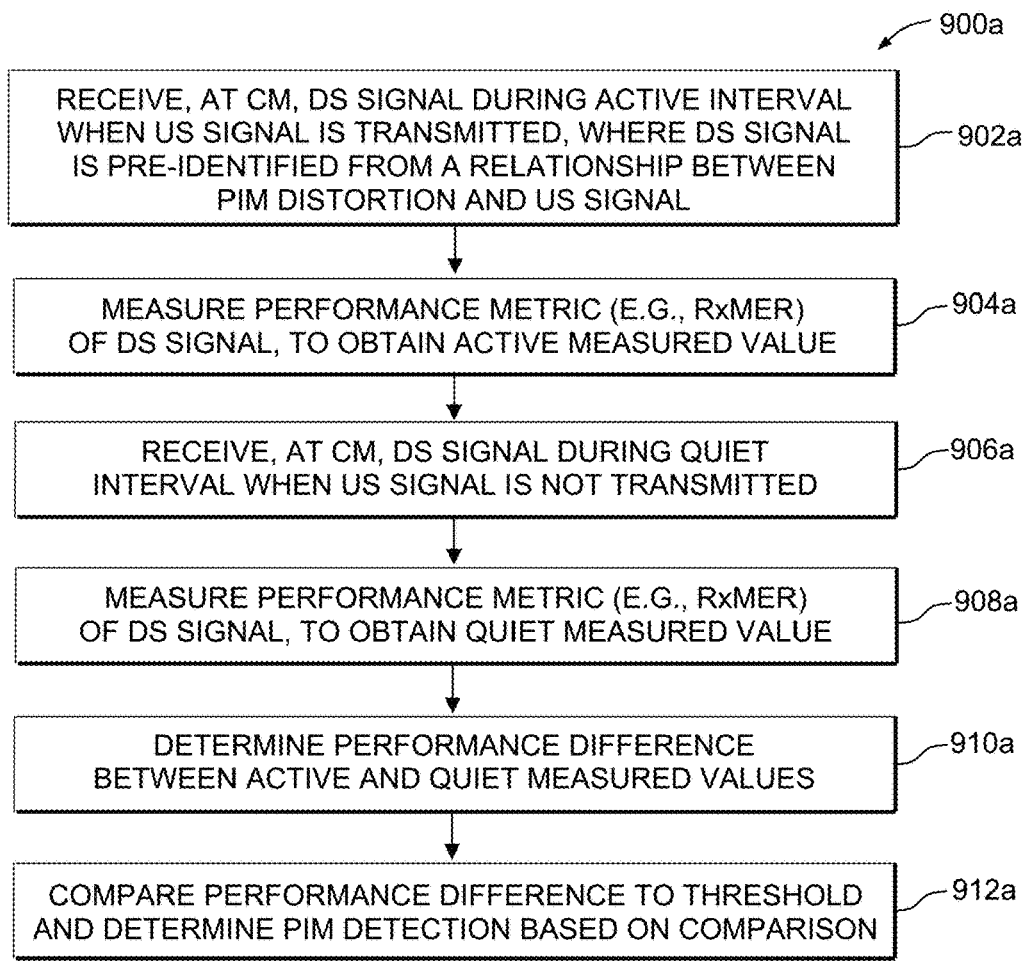
FIGS. 9A and 9B are flow diagrams outlining a first embodiment of the invention and a variation (FIG. 9B), based on receiving a downstream signal in synchronism with active and quiet intervals associated with upstream signal transmission, and measurements of RxMER of the downstream signal received during active and quiet intervals, to determine PIM detection.

Referring to FIG. 9A, a flow diagram outlines a method 900a of the first embodiment. Method 900a utilizes a cable modem in the detection of PIM distortion affecting a downstream signal (e.g., signal 614, or a DS signal occupying multiple channels). The cable modem receives the downstream signal from a cable plant via a subscriber network and transmits an upstream signal to the cable plant via the subscriber network. The upstream signal is transmitted in bursts during active intervals and is not transmitted during quiet intervals. The PIM distortion arises inside the subscriber network and also occurs in bursts that correspond to the upstream transmission bursts. Method 900a comprises multiple steps. In a step 902a, the cable modem receives the downstream signal during an active interval, when the upstream signal is transmitted. The downstream signal is pre-identified from a relationship between PIM distortion and the upstream signal (e.g., equation (1)). In a step 904a, a performance metric (e.g., RxMER) of the downstream signal (received in step 902a) is measured to obtain an "active measured value" (e.g., active RxMER). In a step 906a, the cable modem receives the downstream signal during a quiet interval, when the upstream signal is not transmitted. In a step 908a, the performance metric of the downstream signal (received in step 906a) is measured to obtain a "quiet measured value" (e.g., quiet RxMER). In a step 910a, the difference between the active and quiet measured values is determined, to produce a performance difference (e.g., delta RxMER). Lastly, in a step 912a, the performance difference is compared to a threshold, and based on this comparison a decision is made about whether the PIM distortion has been detected. A suitable threshold may be set within a range of 3 dB to 6 dB, inclusive.

Figure 9B:
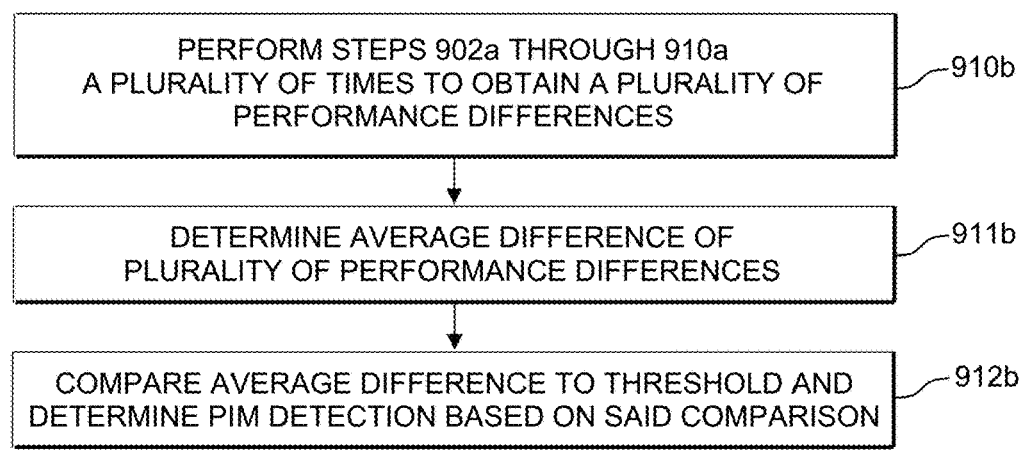

Referring to FIG. 9B, a modification of method 900a is outlined. In a step 910b of the modification, steps 902a through 910a are performed a plurality of times (e.g., 5, 10, 25, 50, 100 times), to obtain a corresponding plurality of performance differences (e.g., delta RxMERs). In a step 911b, an average of the plurality of performance differences is determined, to produce an average difference. Lastly, in a step 912b, the average difference is compared to a threshold, and based on this comparison a decision is made about whether the PIM distortion has been detected. Again, the threshold may be set within the range of 3 dB to 6 dB, inclusive.

Figure 10A:
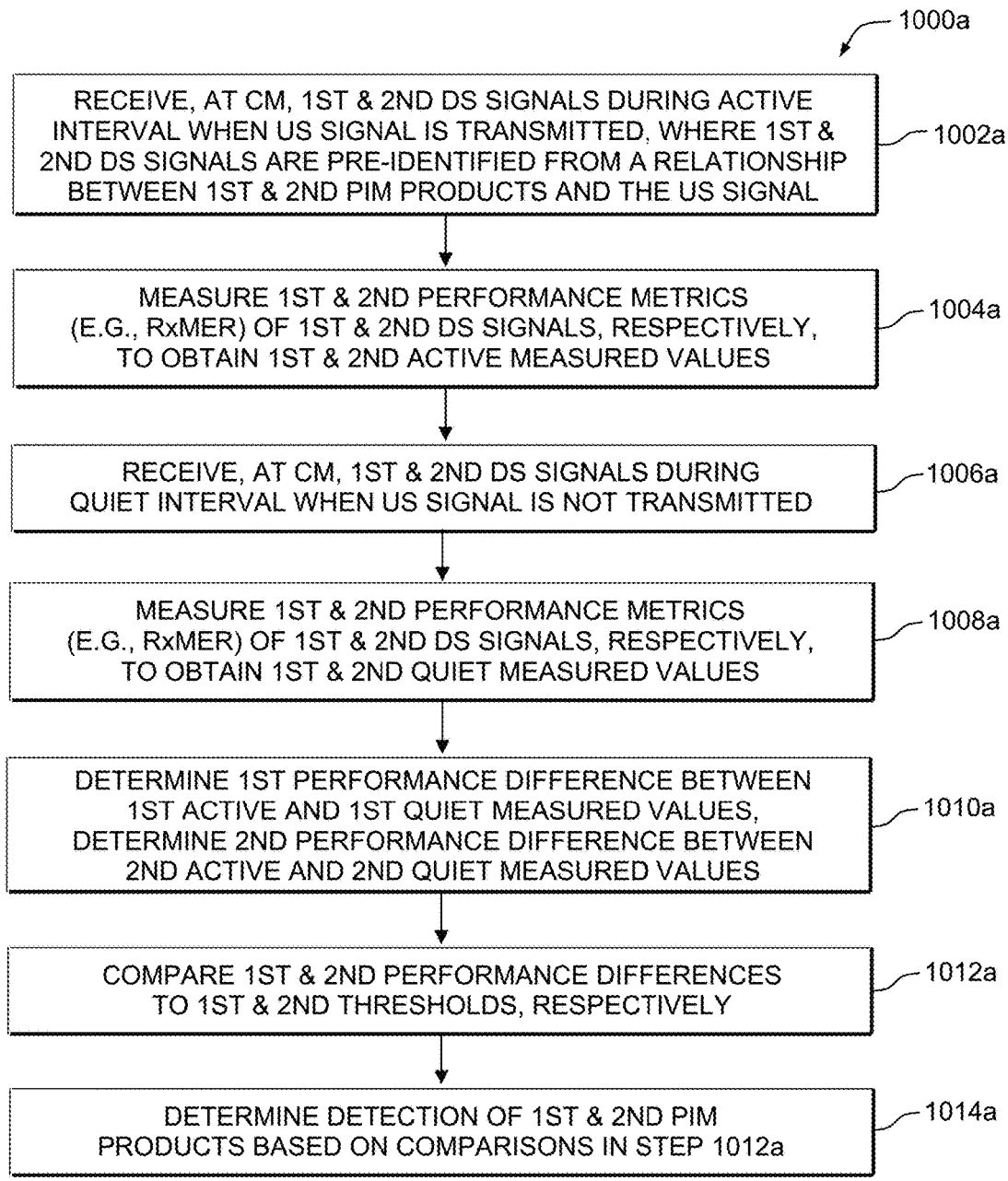
FIGS. 10A and 10B are flow diagrams outlining a more specific version of the first embodiment (FIG. 10A) and of the variation (FIG. 10B), where first and second PIM distortion products (e.g., second and third order products) affect first and second downstream signals.

Referring to FIG. 10A, a flow diagram outlines a method 1000a, which is another version of the first embodiment. Method 1000a utilizes a cable modem in the detection of first and second PIM distortion products affecting first and second downstream signals, respectively (e.g., signals 614 and 616 in FIG. 8). Method 1000a comprises multiple steps. In a step 1002a, the cable modem receives the first and the second downstream signals during an active interval, when the upstream signal is transmitted (FIG. 7). The first and second downstream signals are pre-identified from a relationship (e.g., equation 1) between the first and second PIM distortion products and the upstream signal (FIG. 6). Step 1002a, as recited, is not limited to receiving both downstream signals during the same active interval—they may be received during separate active intervals. In a step 1004a, first and second performance metrics (e.g., both RxMER) of the first and second downstream signals (received in step 1002a) are measured to obtain first and second active measured values (FIG. 8). In a step 1006a, the cable modem receives the first and second downstream signals during a quiet interval, when the upstream signal is not transmitted (FIG. 7). Step 1006a, as recited, is not limited to receiving both downstream signals during the same quiet interval— they may be received during separate quiet intervals. In a step 1008a, first and second performance metrics of the first and second downstream signals (received in step 1006a) are measured to obtain first and second quiet measured values (FIG. 8). In a step 1010a, the difference between active and quiet measured values for each downstream signal is determined, to produce first and second performance differences (e.g., first delta RxMER and second delta RxMER). In a step 1012a, the first and second performance differences are compared to first and second thresholds, respectively. The first and second thresholds may have the same threshold value or different values (e.g., 3 dB may be selected for third order PIM and 6 dB for second order PIM). Lastly, in a step 1014a, the detection of the first and the second PIM products is determined based on the comparisons made in step 1012a.

Figure 10B:
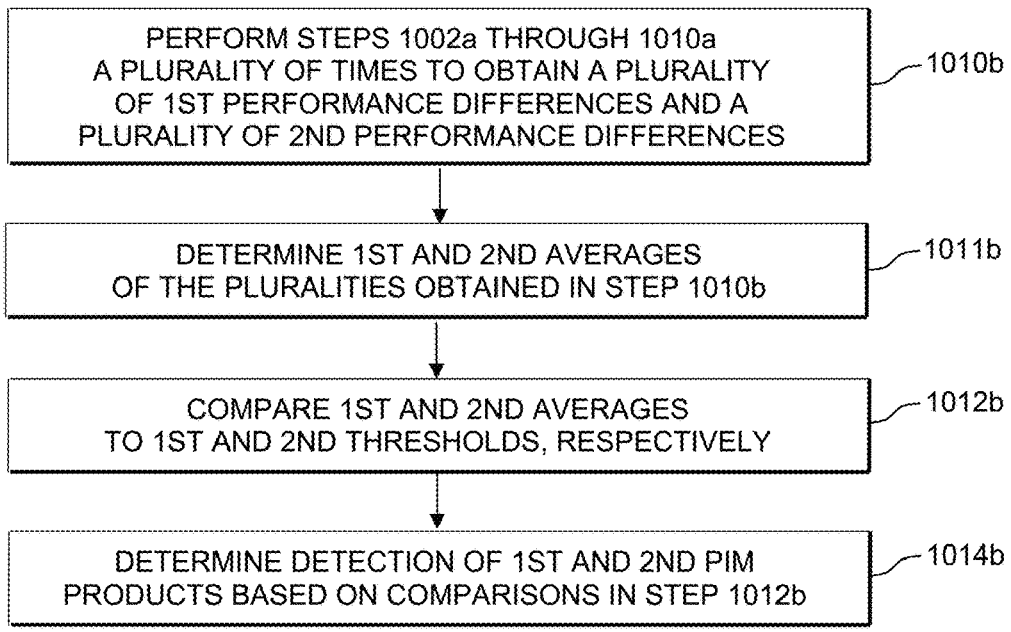

Referring to FIG. 10B, a modification of method 1000a is outlined. In a step 1010b of the modification, steps 1002a through 1010a are performed a plurality of times (e.g., 5, 10, 25, 50, 100 times) to obtain a plurality of first performance differences and a plurality of second performance differences. In a step 1011b, a first average of the plurality of first performance differences is determined and a second average of the plurality of second performance differences is determined. In a step 1012b, the first and second averages are compared to first and second thresholds, respectively. The first and second thresholds may have the same threshold value or different values. The thresholds may be the same as used in unmodified method 1000a. Lastly, in a step 1014b, the detection of the first and second PIM products is determined based on the comparisons made in step 1012b.

The second embodiment of the present invention employs the use of spectrum capture in the cable modem (see previous discussion of cable modem functions with reference to FIG. 5). The second embodiment can be implemented in existing DOCSIS 3.0 and 3.1 cable modems, because they have full spectrum capture modes. A cable modem captures a number of spectrums over a capture execution period; thus, some spectrums will be captured during (or partially during) active intervals (when the upstream signal is transmitted) and some will be captured during quiet intervals (when the upstream signal is not transmitted). This circumstance permits one to utilize the Max Hold and AVG spectrum functions of the cable modem to detect the burst nature of PIM distortion, as experienced in a subscriber network. Typically, in the subscriber network, PIM distortion is tens of dB lower than the carrier or a maximal level in a downstream signal spectrum (e.g., top of haystack in a QAM signal). The carrier or a maximal level is referred to herein as a "high region" of the spectrum. Thus, a Max Hold spectrum at a high region of the downstream signal spectrum will not be significantly affected by PIM distortion. As a result, the difference between Max Hold and AVG spectrums at a high region (e.g., top of QAM haystack) will be stable and approximately 10 dB. However, at a guard band or roll-off region between two QAM signal spectrums (for example) or in an exclusion or vacant band of an OFDM signal spectrum (low region), the PIM distortion level will be comparable to or higher than the noise level of the CM downstream receiver (e.g., downstream receiver 506). Thus, the Max Hold spectrum will pick up a "maximum" level value of the PIM distortion in such low region of the spectrum, while the AVG spectrum will not increase above noise by much because of the averaging of a large number of captured spectrums (many of which do not contain PIM bursts). As a result, the difference between the Max Hold and AVG spectrums at such a low region will be significantly more than at a high region of the spectrums. This result is an indicator of the burst nature of the PIM distortion and provides at least some validation that burst PIM (arising in subscriber network) has been detected. Further, the levels at high and low regions of the Max Hold spectrum allows one to estimate a "receive carrier-to-noise ratio" (RxCNR) value, which is also used to indicate a detection of burst PIM distortion.

Figure 11:
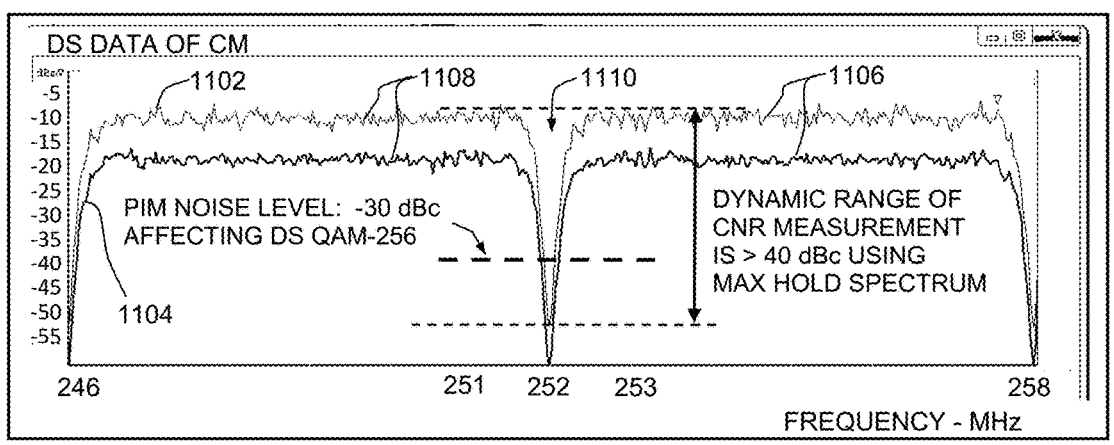
FIG. 11 is a diagram of maximum hold (Max Hold) and averaged (AVG) spectrums, produced by a cable modem from a plurality of captured spectrums of two adjacent downstream QAM channels, and showing a roll-off region (or guard band) centered at 252 MHz, used in a measurement of downstream receive carrier-to-noise ratio (RxCNR), to determine PIM detection.

The second embodiment will now be further described with reference to FIGS. 11-16. In FIG. 11, a Max Hold spectrum 1102 and an AVG spectrum 1104 are shown. Spectrums 1102 and 1104 were produced by a cable modem from a number of captured spectrums of two adjacent downstream QAM-256 channel signals 1106 and 1108. The spectrums were captured using a resolution bandwidth of 30 kHz. Between channel signals 1106 and 1108 is a roll-off region (or guard band) 1110, centered at 252 MHz. As shown, the dynamic range of a potential RxCNR measurement off of Max Hold spectrum 1102 is greater than 40 dBc. Also shown is a −30 dBc level (broken line) of potential PIM distortion (noise), which would adversely affect the downstream QAM-256 signals. This PIM level would be picked up in Max Hold spectrum 1102 at roll-off region 1110. FIG. 11 also illustrates low and high regions of spectrums 1102 and 1104. The low region is roll-off region/guard band 1110 at 252 MHz and a high region is at, e.g., 251 MHz or 253 MHz. Also, note that there is about a 10 dB difference between Max Hold spectrum 1102 and AVG spectrum 1104 at the high regions (or top of QAM haystacks).

Figure 12A:
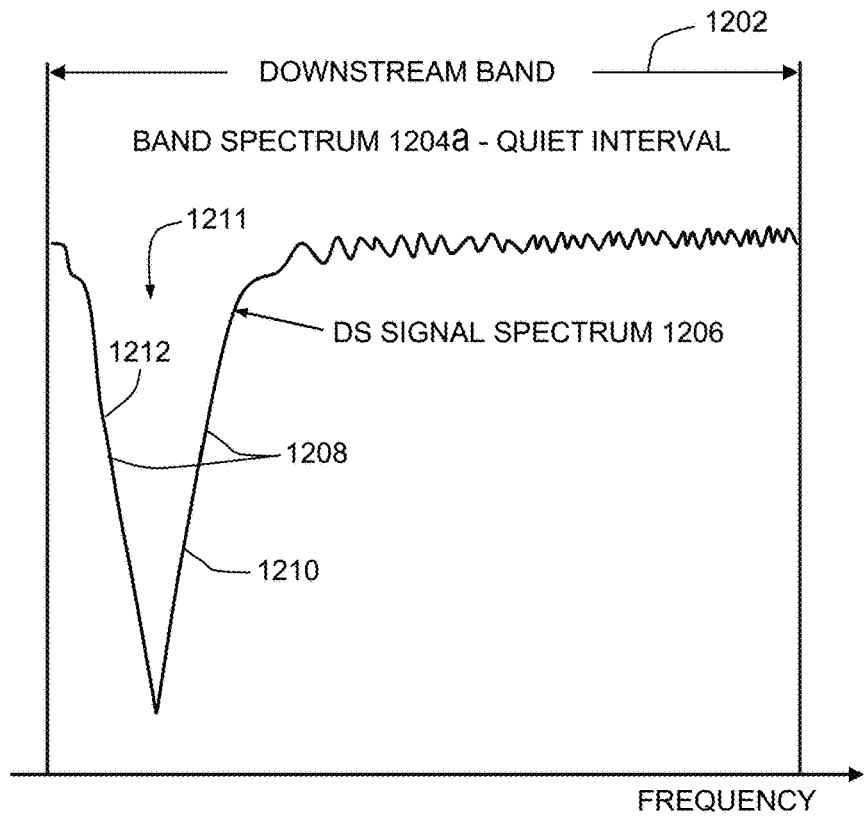
FIGS. 12A & 12B are companion diagrams illustrating a frequency spectrum contained in a selected downstream band ("band spectrum") during a quiet interval (FIG. 12A) and during an active interval (FIG. 12B), where the band spectrum in FIG. 12A is a spectrum of a downstream signal (e.g., portions of two adjacent QAM channel signals) and the band spectrum in FIG. 12B includes the aforesaid downstream signal spectrum and a spectrum of PIM distortion products.

FIG. 12A shows a downstream band 1202 containing a band spectrum 1204a during a quiet interval. Spectrum 1204a is the product of a single spectrum capture by a cable modem, taken during the quiet interval. In this discussion, "band spectrum" means the composite spectrum of all signals and noise contained in downstream band 1202. Band spectrum 1204a includes a downstream signal spectrum 1206 of a downstream signal 1208 (assuming no receiver noise). The term "downstream signal," when used in connection with a downstream band (e.g., band 1202), means signal components in the downstream band that are part of the signal traffic transmitted in the cable plant by a cable operator. The "downstream signal" may represent a complete signal (e.g., a QAM channel signal or a 192 MHz OFDM signal), more than one complete signal, a part of a signal, or parts of more than one signal. As shown in FIG. 12A, downstream signal spectrum 1206 (downstream signal 1208) comprises parts 1210 and 1212 of two adjacent QAM signals separated by a roll-off or guard band region 1211. In some applications involving two adjacent QAM signals, it may be preferred to set the downstream band at ±1 MHz, centered in roll-off/guard band region 1211. Note, in FIG. 12A, there are no PIM components in region 1211 (captured during quiet interval).

Figure 12B:
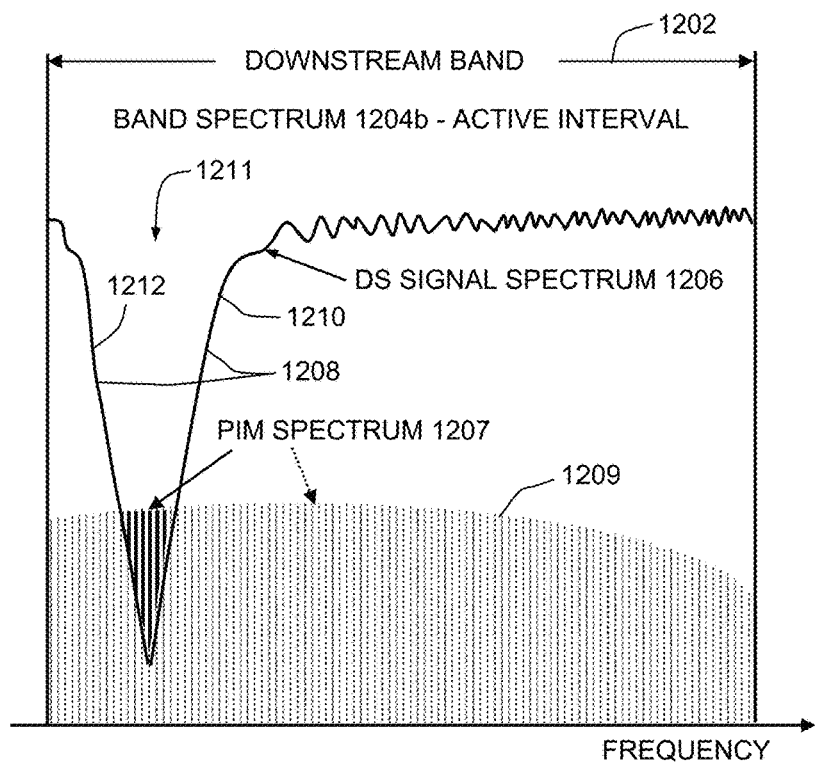

FIG. 12B is comparable to FIG. 12A, but shows downstream band 1202 containing a band spectrum 1204b during an active interval. Spectrum 1204b is the product of a single spectrum capture by the cable modem, taken during the active interval. Band spectrum 1204b includes downstream signal spectrum 1206 of downstream signal 1208 and a PIM distortion spectrum 1207 of a PIM distortion signal 1209. Note that PIM spectrum 1207 is significantly below a high region (top of QAM haystack) of downstream signal spectrum 1206; thus, spectrum captures (during active intervals) are not likely to be affected by the PIM in such high regions. However, note that PIM spectrum 1207 overlaps roll-off region 1211 of downstream signal spectrum 1206 and thus is available for spectrum capture. Spectrum captures (during active intervals) will be affected by the PIM in such low regions. This difference in affect on spectrum capture at high and low regions serves as a mechanism for PIM detection in the second embodiment of the invention.

The time span for a spectrum capture mode in the cable modem (to carry out the second embodiment of the invention) must be long enough to capture band spectrums that include PIM distortion (i.e., that overlap active intervals). This time span may be tenths of a second long or as much as 10 plus seconds long. In one example, the time span is long enough to capture about 100 band spectrums to establish a high probability of capturing spectrums affected by PIM bursts. The particular number of captured spectrums required for reliable PIM detection may be determined for particular applications by experiment or calibration.

Figure 13:
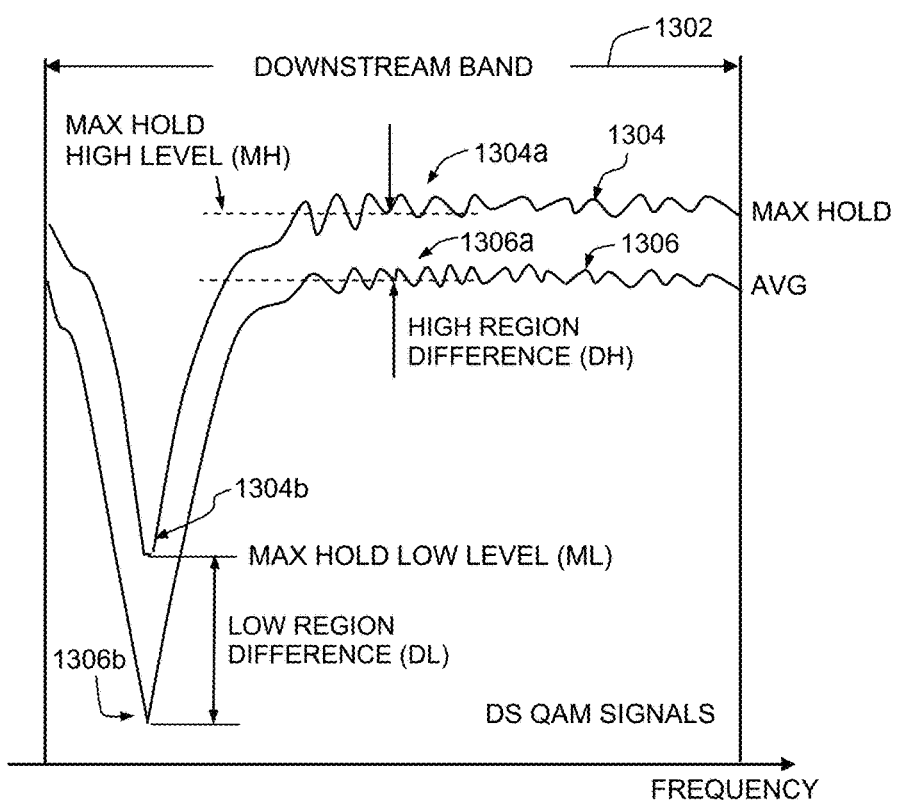
FIG. 13 is a diagram showing Max Hold and AVG spectrums of portions of adjacent QAM downstream channel signals, the Max Hold and AVG spectrums being produced by a cable modem from a plurality of captured spectrums of the downstream band (as in FIGS. 12A & 12B), and showing measured quantities used in detecting PIM distortion.

Referring now to FIG. 13, the metrics used in carrying out the methods of the second embodiment will now be described. In this example, a cable modem has performed 100 spectrum captures over a span of time that overlaps a number of active and quiet intervals. Each spectrum capture includes a band spectrum contained in a downstream band 1302. A Max Hold spectrum 1304 and an AVG spectrum 1306 are created by the cable modem from the 100 captured spectrums (i.e., the band spectrums within band 1302). Downstream band 1302 should be selected to include a downstream signal having a spectrum with high and low regions (e.g., see FIGS. 12A & 12B). In this example, the downstream signal spectrum is as shown in FIG. 12A, which includes part of two downstream QAM channel signals separated by a guard band or roll-off region. As shown in FIG. 13, Max Hold spectrum 1304 and AVG spectrum 1306 substantially maintain the high and low regions of the downstream signal spectrum. That is, spectrums 1304 and 1306 each have high and low regions that correspond to the high and low regions of the downstream signal spectrum. This is so because the captured (band) spectrums are predominately the downstream signal spectrum (compare FIG. 12A with FIG. 12B). As shown in FIG. 13, Max Hold spectrum 1304 has a high region 1304a and a low region 1304b. High region 1304a corresponds to the top of the haystack of one QAM channel signal and low region 1304b corresponds to the bottom of the guard band or roll-off region between the two QAM channel signals. Similarly, AVG spectrum 1306 has a corresponding high region 1306a and a corresponding low region 1306b.

As shown in FIG. 13, the difference in levels at Max Hold high region 1304a and AVG high region 1306a is a high region difference DH. The difference in levels at Max Hold low region 1304b and AVG low region 1306b is a low region difference DL. In a first method of the second embodiment, if DL is greater than DH (DL>DH), a conclusion may be drawn that PIM distortion has likely been detected in band 1302. It is preferred that such conclusion be drawn if DL is greater than DH by some threshold value, such as, e.g., 6 dB.

Also in FIG. 13, the level at Max Hold high region 1304a is MH and the level at Max Hold low region 1304b is ML. In a second method of the second embodiment, RxCNR is determined generally from the ratio of MH over ML. For example, if the resolution bandwidth of the spectrum analyzer of the cable modem is 30 kHz, then the RxCNR can be estimated from the formula: RxCNR=(MH+14 dB)/ML, where 14 dB is the coefficient for recalculation of Max Hold spectrum 1304 at 30 kHz to the actual QAM level. The RxCNR calculated here will be referred to as the "initial RxCNR," relating to the initial cable modem. RxCNR is also determined in the same manner for a plurality of other cable modems in the cable plant (e.g., within the same node), which transmit upstream signals with the same spectrum (same frequencies) as the initial modem. If the initial RxCNR is less than the highest RxCNR determined among the other cable modems ("highest RxCNR"), a conclusion may be drawn that PIM distortion has likely been detected at the initial cable modem. It is preferred that such conclusion be drawn if initial RxCNR is less than highest RxCNR by some threshold value, such as, e.g., 3 dB, 4 dB, 5 dB, or 6 dB.

In a third method, the first and second methods are combined to detect PIM. That is, the conditions, DL>DH and initial RxCNR<highest RxCNR, are used together to determine PIM detection. In such combined method, one condition may be a primary indicator of PIM detection and the other may serve as confirmation of detection.

Figure 14:
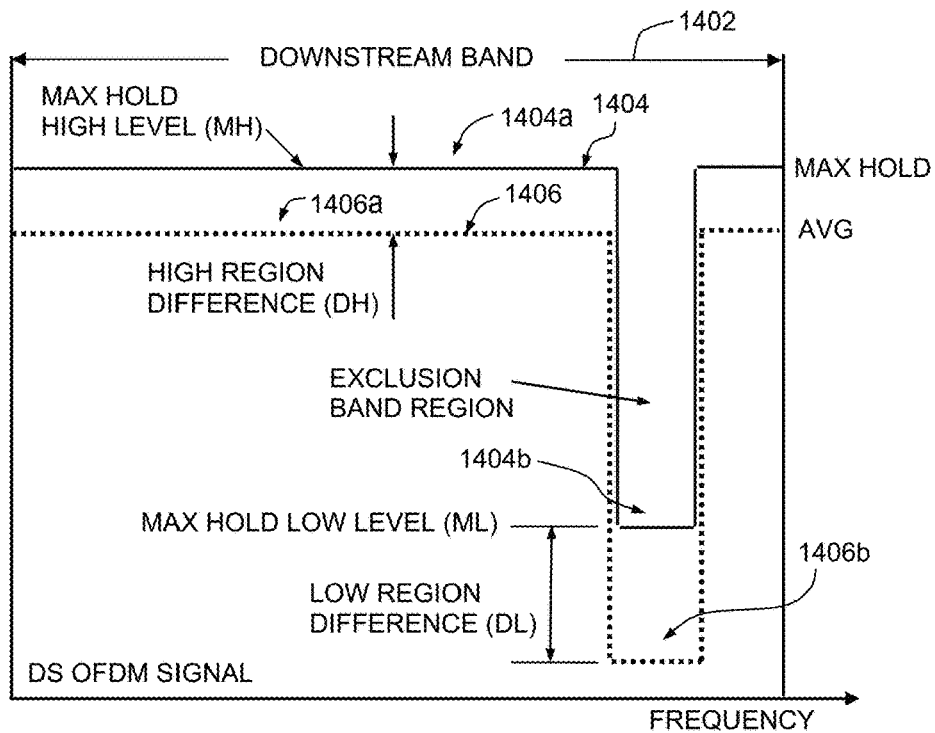
FIG. 14 is an OFDM signal equivalent of FIG. 13, showing Max Hold and AVG spectrums of a portion of a downstream OFDM signal containing an exclusion band, produced by a cable modem from a plurality of captured spectrums of the downstream band, and showing measured quantities—high and low region differences and Max Hold high and low level values used in determining PIM detection.

FIG. 14 shows another example of the methods of the second embodiment. In this example, the methods operate with respect to a DOCSIS 3.1 downstream OFDM signal. The OFDM signal has been modified according to the DOCSIS 3.1 Specification to include an exclusion band. The exclusion band is created by assigning zero value to a contiguous block of subcarriers in the OFDM signal. A suitable exclusion band may be 500 kHz to 1 MHz wide (10-20 subcarriers for 50 kHz spacing and 20-40 subcarriers for 25 kHz spacing). The exclusion band establishes a low region for the spectrum of the downstream OFDM signal, and the remainder of the spectrum may serve as a high region. In this example, a cable modem has performed 100 spectrum captures over a span of time that overlaps active and quiet intervals. Each spectrum capture includes a band spectrum contained in a downstream band 1402. A Max Hold spectrum 1404 and an AVG spectrum 1406 are created by the cable modem from the 100 captured spectrums (i.e., the band spectrums within band 1402). Max Hold and AVG spectrums 1404 and 1406 substantially maintain the high and low regions of the downstream OFDM signal spectrum. That is, spectrums 1404 and 1406 each have high and low regions that correspond to high and low regions of the downstream OFDM signal spectrum. As shown in FIG. 14, Max Hold spectrum 1404 has a high region 1404a and a low region 1404b. Low region 1404b corresponds to the exclusion band region of Max Hold spectrum 1404. Similarly, AVG spectrum 1406 has a corresponding high region 1406a and a corresponding low region 1406b.

As shown in FIG. 14, the difference in levels at Max Hold high region 1404a and AVG high region 1406a is a high region difference DH. The difference in levels at Max Hold low region 1404b and AVG low region 1406b is a low region difference DL. In the first method, if DL is greater than DH (DL>DH), a conclusion may be drawn that PIM distortion has likely been detected. It is preferred that such conclusion be drawn if DL is greater than DH by some threshold value, such as, e.g., 6 dB. Also, the level at Max Hold high region 1404a is MH and the level at Max Hold low region 1404b is ML. In the second method, RxCNR is determined by the ratio of MH over ML (an "initial RxCNR" at an initial cable modem). RxCNR is also determined in the same manner for a plurality of other cable modems in the cable plant (e.g., within the same node), which transmit upstream signals with the same spectrum (same frequencies) as the initial modem. If the initial RxCNR is less than the highest RxCNR determined among the other cable modems ("highest RxCNR"), a conclusion may be drawn that PIM distortion has likely been detected at the initial modem. It is preferred that such conclusion be drawn if initial RxCNR is less than highest RxCNR by some threshold value, such as, e.g., 3 dB, 4 dB, 5 dB, or 6 dB. In the third method, the first and second methods are combined, as discussed previously.

Figure 15:
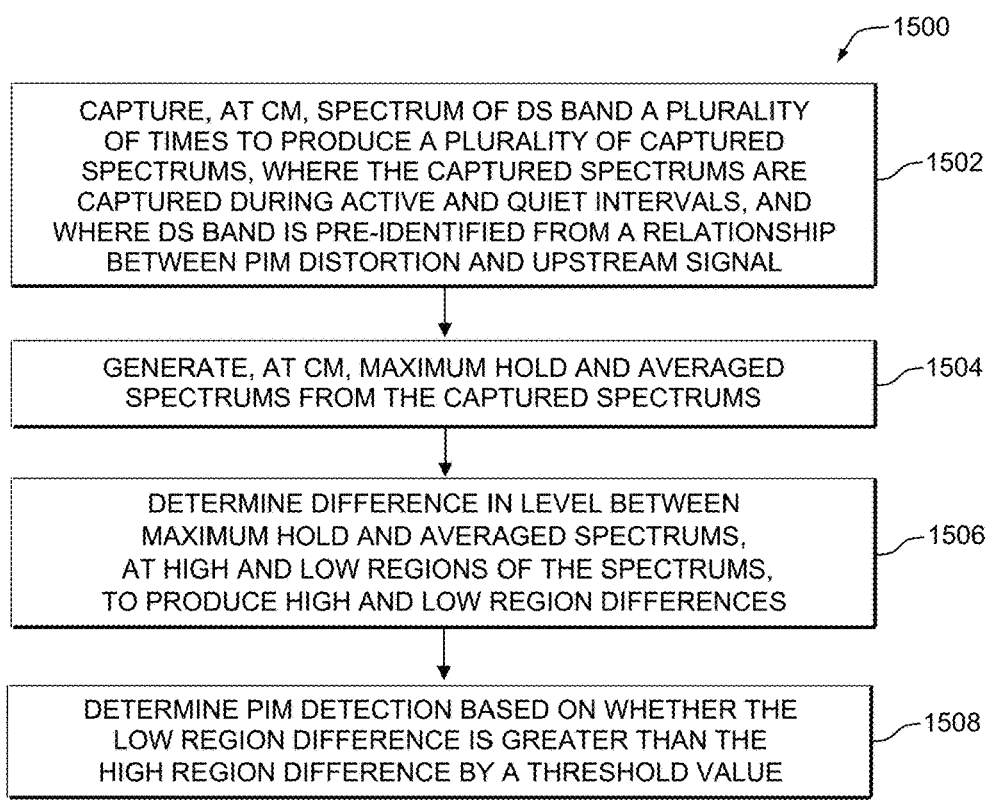
FIG. 15 is a flow diagram outlining a first method of a second embodiment of the invention, where Max Hold and AVG spectrums are produced from a plurality of captured spectrums in a downstream band, and where the difference between Max Hold and AVG spectrums, at high and low regions, are determined and used to detect PIM.

Referring now to FIG. 15, a flow diagram outlines a method 1500 of the second embodiment. Method 1500 utilizes a cable modem in the detection of PIM distortion affecting a downstream signal (e.g., signal 1208) in a downstream band (e.g., band 1202). The cable modem receives the downstream signal from a cable plant via a subscriber network and transmits an upstream signal to the cable plant via the subscriber network. The upstream signal is transmitted in bursts during active intervals and is not transmitted during quiet intervals. The PIM distortion arises inside the subscriber network and occurs in bursts that correspond to the upstream transmission bursts. The downstream signal has a downstream signal spectrum (e.g., spectrum 1206 in FIG. 12A) with high and low regions, and the PIM distortion has a PIM spectrum (e.g., spectrum 1207) that overlaps at least the low region of the downstream signal spectrum (see, e.g., FIG. 12B). The downstream band (e.g., band 1202) contains a spectrum that (i) includes the downstream signal spectrum (e.g., spectrum 1206) and does not include the PIM spectrum during a quiet interval (FIG. 12A), and (ii) includes the downstream signal spectrum and PIM spectrum (e.g., spectrums 1206 and 1207) during an active interval (FIG. 12B).

As shown in FIG. 15, method 1500 comprises several steps. In a step 1502, the spectrum of the downstream band (band spectrum) is captured, at the cable modem, a plurality of times to produce a plurality of captured spectrums (e.g., 100 captured spectrums). The spectrums are captured during active and quiet intervals. The downstream band (e.g., band 1202 or 1302) is pre-identified from a relationship between the PIM distortion and the upstream signal (e.g., equation (1)). In a step 1504, Max Hold and AVG spectrums are generated, at the cable modem, from the plurality of captured spectrums (FIG. 13). The Max Hold and AVG spectrums substantially maintain the high and low regions of the downstream signal spectrum. That is, the Max Hold and AVG spectrums each have high and low regions that correspond to the high and low regions of the downstream signal spectrum (compare FIG. 13 to FIG. 12A). In a step 1506, a difference in level is determined between the Max Hold and AVG spectrums at the high and low regions of the spectrums, to produce a high region difference (DH) and a low region difference (DL). Lastly, in a step 1508, a determination is made whether PIM distortion has been detected based on whether DL>DH by a threshold value (FIG. 13). A suitable threshold value is 6 dB.

Figure 16:
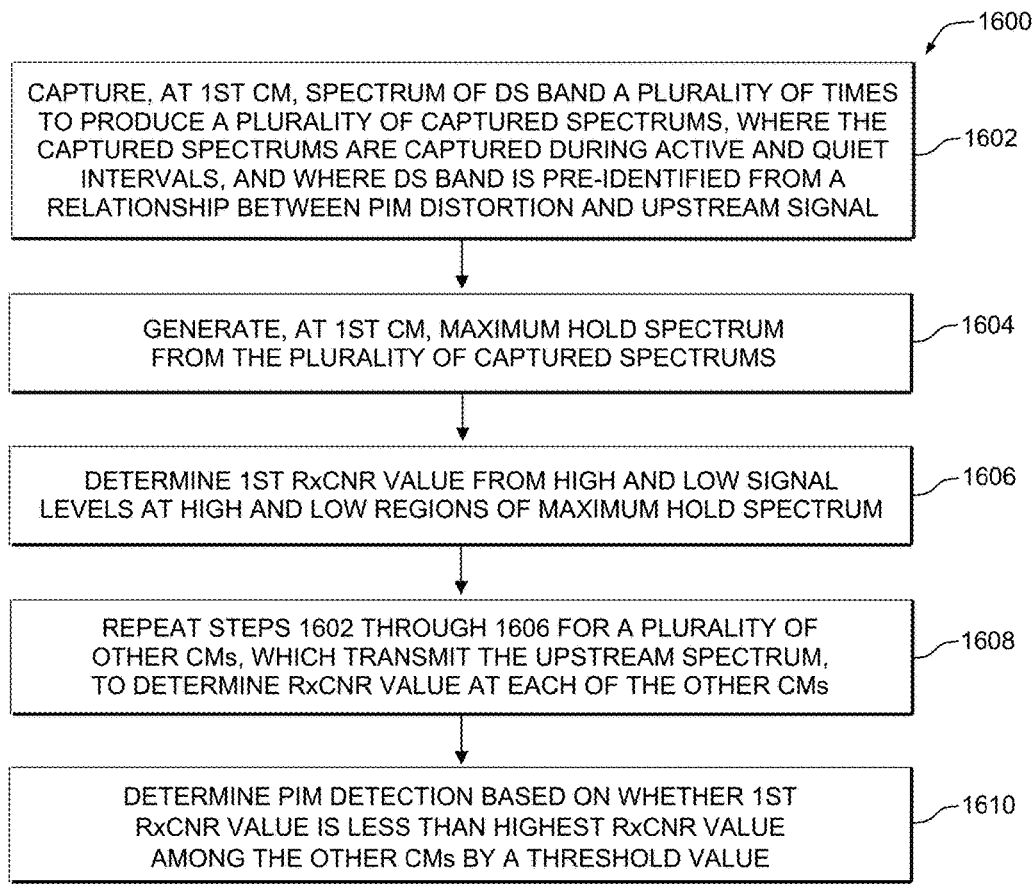
FIG. 16 is a flow diagram outlining a second method of the second embodiment of the invention, where a Max Hold spectrum is produced at a cable modem from a plurality of captured spectrums in a downstream band, where levels of the Max Hold spectrum at high and low regions are measured and used to determine a first RxCNR, and where a RxCNR is similarly determined at other cable modems and used together with the first RxCNR to detect PIM.

Referring now to FIG. 16, a flow diagram outlines a method 1600 of the second embodiment. Method 1600 utilizes a first cable modem in the detection of PIM distortion affecting a downstream signal (e.g., signal 1208) in a downstream band (e.g., band 1202). The first cable modem receives the downstream signal from a cable plant via a subscriber network and transmits a first upstream signal to the cable plant via the subscriber network. The first upstream signal is transmitted in bursts during active intervals and is not transmitted during quiet intervals. The PIM distortion arises inside the subscriber network and occurs in bursts that correspond to the upstream transmission bursts. The downstream signal has a downstream signal spectrum (e.g., spectrum 1206 in FIG. 12A) with high and low regions, the first upstream signal has a first upstream spectrum (FIG. 6; 606), and the PIM distortion has a PIM spectrum (e.g., spectrum 1207) that overlaps at least the low region of the downstream signal spectrum (see, e.g., FIG. 12B). The downstream band (e.g., band 1202) contains a spectrum that (i) includes the downstream signal spectrum (e.g., spectrum 1206) and does not include the PIM spectrum during quiet intervals (FIG. 12A), and (ii) includes the downstream signal spectrum and PIM spectrum (e.g., spectrums 1206 & 1207) during active intervals (FIG. 12B). A plurality of other cable modems is coupled to the cable plant via a plurality of other subscriber networks, respectively (FIG. 1). Each of the other cable modems receives the downstream signal from the cable plant and transmits to the cable plant, at assigned active intervals, another upstream signal. The other upstream signal has substantially the same spectrum as the first upstream signal. The other cable modems do not transmit during quiet periods.

As shown in FIG. 16, method 1600 involves several steps. In a step 1602, the spectrum of the downstream band (band spectrum) is captured, at the first cable modem, a plurality of times to produce a plurality of captured spectrums (e.g., 100 captured spectrums). The spectrums are captured during active and quiet intervals. The downstream band (e.g., band 1202 or 1302) is pre-identified from a relationship between the PIM spectrum (e.g., spectrum 1207) and the first upstream spectrum (e.g., equation (1)). In a step 1604, a Max Hold spectrum is generated, at the first cable modem, from the plurality of captured spectrums (FIG. 13). The Max Hold spectrum substantially maintains the high and low regions of the downstream signal spectrum. That is, the Max Hold spectrum has high and low regions that correspond to the high and low regions of the downstream signal spectrum (compare FIG. 13 to FIG. 12A). The Max Hold spectrum has high and low signal levels at its high and low regions, respectively (FIG. 13). In a step 1606, a first RxCNR is determined from the high and low signal levels of the Max Hold spectrum. In a step 1608, steps 1602 through 1606 are repeated for each of the other cable modems to determine a RxCNR at each other modem. Lastly, in a step 1610, if the first RxCNR is less than the highest RxCNR among the other cable modems by a threshold value, then it is determined that the PIM distortion has likely been detected. A suitable threshold value is in the range of 3 to 6 dB, inclusive.

The third embodiment of the invention will now be described with reference to FIGS. 17-21. The third embodiment concerns a method or methods of determining the presence of a nonlinear component in a subscriber network coupled between a cable plant and a cable modem. The cable modem receives a downstream signal, in a downstream band, from the cable plant via the subscriber network. The downstream signal has a downstream signal spectrum characterized by high and low regions. The third embodiment utilizes an operating mode of the cable modem where the burst upstream signal is a narrowband signal or a plurality of narrowband signals ("narrowband mode"). The narrowband signal (or each narrowband signal of a plurality) may be a single-frequency continuous wave (CW) signal (or carrier, tone, pilot, etc.). With respect to this embodiment, "narrowband signal" means a signal having a single frequency or having a bandwidth no greater than about the bandwidth of a typical roll-off region or guard band associated with adjacent downstream QAM channel signals. The bandwidth of a roll-off region or guard band is generally defined to be the −20 dBc to −30 dBc point on the skirt of each adjacent QAM signal spectrum. One way to implement the narrowband mode of a cable modem is to utilize the "CW Tone Method" of channel sounding, where a single CW signal or a set of CW signals ("tones") are transmitted in the upstream band, in bursts, during active intervals. The signals are received by other modems, which measure MER values of the signals. Channel sounding is discussed in the DOCSIS 3.1 specification, and is employed to assign cable modems to Interference Groups. Interference Groups help manage and avoid upstream-to-downstream interference among cable modems in a Full Duplex system (see DOCSIS 3.1 Specification, pp. 25 & 264-70).

Figure 17:
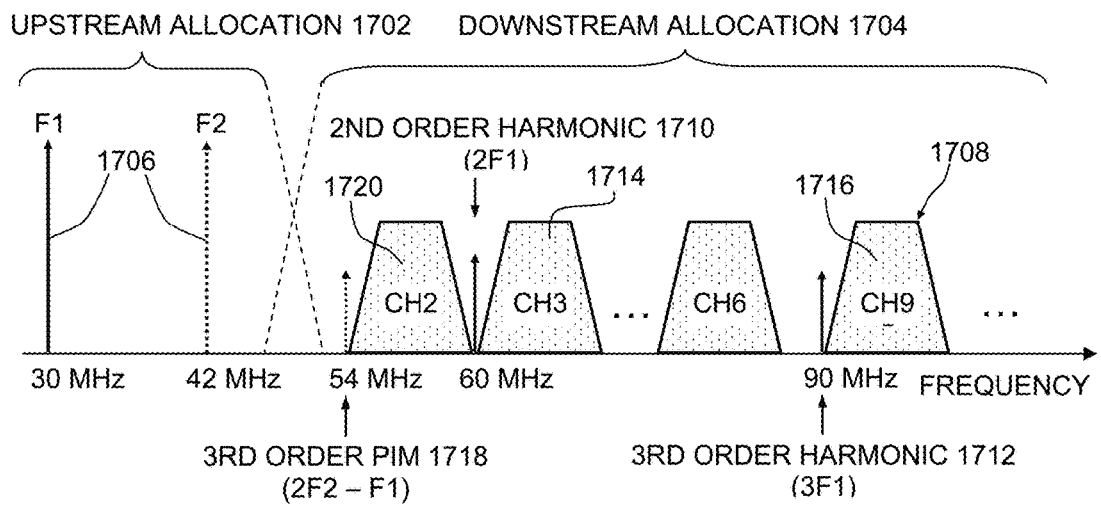
FIG. 17 is a spectrum diagram of a third embodiment of the present invention, illustrating a pair of upstream continuous wave (CW) signals and a number of downstream QAM channel signals, and second and third order PIM distortion products among the downstream QAM signals.

With reference to FIG. 17, examples of the third embodiment will be described. FIG. 17 shows a (cable television) spectrum 1700 of signals divided into an upstream allocation 1702 and a downstream allocation 1704. An upstream signal 1706 is in upstream allocation 1702 and includes two CW signals at frequencies F1 and F2, respectively. A number of downstream QAM signals 1708 are organized in contiguous downstream channels, in downstream allocation 1704 (i.e., QAM channel signals). In a first example, the upstream CW signal at frequency F1 is transmitted by a cable modem (e.g., CM 316 in FIG. 3) through a subscriber network (e.g., network 300 in FIG. 3) and interacts with a nonlinear component that network, causing a second order PIM distortion product 1710 and a third order PIM distortion product 1712. PIM product 1710 is the second harmonic (2F1) and PIM product 1712 is the third harmonic (3F1) of the CW signal at frequency F1. Note that PIM product 1710 is located (i.e., located in frequency) within a guard band or roll-off region associated with QAM channel signals 1720 & 1714 (Channels 2 & 3) and PIM product 1712 is located within a guard band or roll-off region associated with QAM channel signal 1716 (Channel 9). As shown in FIG. 17, the actual frequency of CW signal at F1 is 30 MHz (F1=30 MHz). The 30 MHz frequency was selected because the second and third harmonics of this frequency (i.e., 60 MHz & 90 MHz, respectively) would be produced at the guard bands or roll-off regions associated with QAM channel signals 1720, 1714 & 1716.

In a second example, F2 is selected to be 42 MHz to produce a third order harmonic at 126 MHz, which is centered within a guard band/roll-off region between Channels 14 and 15 (not shown). The aforesaid references to channel numbers correspond to the Federal Communication Commission's standard channel allocations for the United States. In a third example (see FIG. 17), the cable modem is operated to transmit two CW signals (F1 and F2) in the upstream frequency band. The cable modem (e.g., CM 316 in FIG. 3) transmits the two CW signals through the subscriber network (e.g., network 300 in FIG. 3), which interact together with a nonlinear component in the network, causing a third order PIM distortion product 1718 at 54 MHz. PIM product 1718 is a third order difference product (2F2-F1) of both CW signals (F1 and F2). Frequencies F1 (30 MHz) and F2 (42 MHz) were selected to produce the third order difference product 1718 at 54 MHz ((2×42)−30)=54), which is within the guard band/roll-off region associated with QAM channel signal 1720 (Channel 2).

As discussed, the frequency of the upstream CW signal (F1 and/or F2) is selected to produce an expected PIM distortion product or products within a guard band/roll-off region or guard bands/roll-off regions associated with a downstream QAM channel signal or signals (or in a comparable (in width) vacant or exclusion band or bands associated with an OFDM signal). As discussed, the expected PIM product or products can be determined in advance using equation (1) or equivalent expressions. Equation (1) and its results define a relationship between a PIM distortion product and the upstream signal (in this case, the upstream signal is CW signal at F1 and/or CW signal at F2).

Figure 18A:
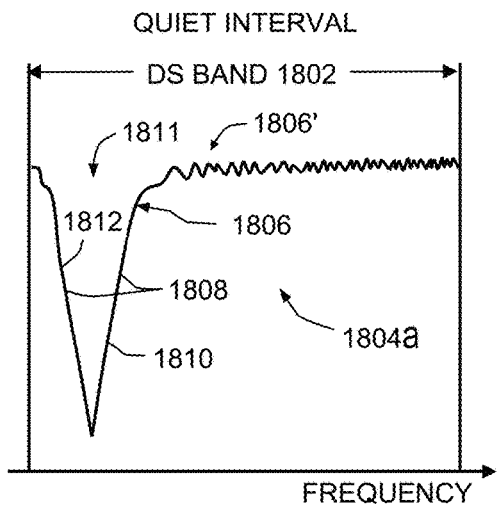
FIGS. 18A & 18B are companion diagrams illustrating a frequency spectrum contained in a selected downstream band ("band spectrum") during a quiet interval (FIG. 18A) and during an active interval (FIG. 18B), where the band spectrum in FIG. 18A is a spectrum of a downstream signal (e.g., portions of two adjacent QAM channel signals) and the band spectrum in FIG. 18B includes the aforesaid downstream signal spectrum and a spectrum of a PIM distortion product.

Now that the upstream signal has been configured to place expected PIM distortion products in specific frequency locations in the downstream signal, the actual produced PIM products must be detected. The detection process is similar to the methods described for the second embodiment. In the first steps toward detection, the spectrum of the downstream band is captured a plurality of times to produce a plurality of captured spectrums, and then a Max Hold spectrum is generated from the captured spectrums. This was illustrated for the second embodiment in FIGS. 12A, 12B, 13, & 14. It is described for the third embodiment with reference to FIGS. 18A, 18B & 19. FIG. 18A shows a downstream band 1802 containing a band spectrum 1804a during a quiet interval. Spectrum 1804a is the product of a single spectrum capture by a cable modem, taken during the quiet interval. Band spectrum 1804a includes a downstream signal spectrum 1806 of a downstream signal 1808 (assuming no receiver noise). Downstream signal spectrum 1806 comprises parts 1810 and 1812 of two adjacent QAM channel signals separated by a roll-off or guard band region 1811. In some applications involving two adjacent QAM signals, it may be preferred to set the downstream band at ±1 MHz, centered in roll-off/guard band region 1811. Downstream signal spectrum 1806 has a high region 1806' at the top of the QAM haystack and a low region, which is roll-off or guard band region 1811. Note, there are no PIM components in region 1811 (because the spectrum was captured during a quiet interval).

Figure 18B:
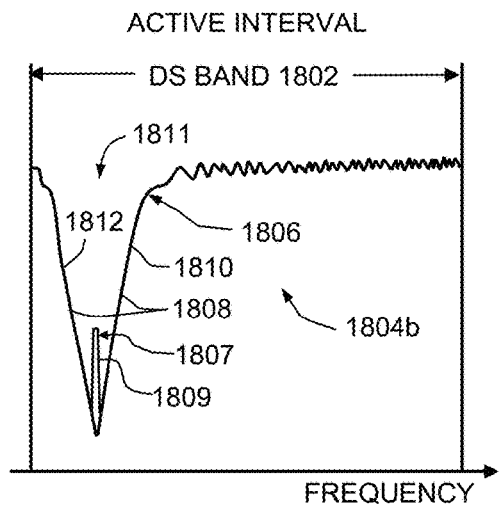

FIG. 18B is comparable to FIG. 18A, but shows downstream band 1802 containing a band spectrum 1804b during an active interval. Spectrum 1804b is the product of a single spectrum capture by the cable modem, taken during the active interval. Band spectrum 1804b includes downstream signal spectrum 1806 and a PIM distortion product spectrum 1807 of a PIM distortion product signal 1809. PIM spectrum 1807 is significantly below high region 1806' of downstream signal spectrum 1806; thus, spectrum captures during active intervals are not likely to be affected by the PIM in such high regions. However, PIM spectrum 1807 is located (centered) within roll-off region 1811 (low region) of downstream signal spectrum 1806 and is relatively prominent or visible (and thus available for spectrum capture). Spectrum captures (during active intervals) will be affected by the PIM in such low regions. This difference in affect on spectrum capture at high and low regions is a basis for detecting the PIM distortion product, in accordance with the third embodiment. Further, the narrowband aspect of the PIM distortion product makes it easy to detect (good sensitivity is achieved).

The time span for spectrum capture in the cable modem (for the third embodiment) must be long enough to capture band spectrums that include PIM distortion (i.e., that overlap active intervals). This time span may be tenths of a second long or as much as 10 plus seconds long. In one example, the time span is long enough to capture about 100 band spectrums to establish a high probability of capturing (band) spectrums containing PIM distortion products. The particular number of captured spectrums required for reliable PIM detection may be determined for particular applications by experiment or calibration.

In an alternative implementation, the spectrum capture at the cable modem may be synchronized to the active intervals. In such case, each captured spectrum would contain both the downstream signal spectrum and the PIM distortion spectrum. Additional, but straightforward programming of the cable modem may be required to implement synchronized capture of band spectrums 1804b during active intervals ("sync capture"). See the previous discussion of synchronization and programming of CM 500, regarding the first embodiment. With sync capture, only a single or few spectrum captures (e.g., FIG. 18B) may be necessary to accomplish adequate PIM detection (with reasonable sensitivity). However, a greater number of captures may be necessary or desirable to achieve a preferred level of detection sensitivity. As discussed below with reference to FIG. 19, the captured spectrums are used to generate a Max Hold spectrum, from which parameters MH and ML are obtained for detection.

Figure 19:
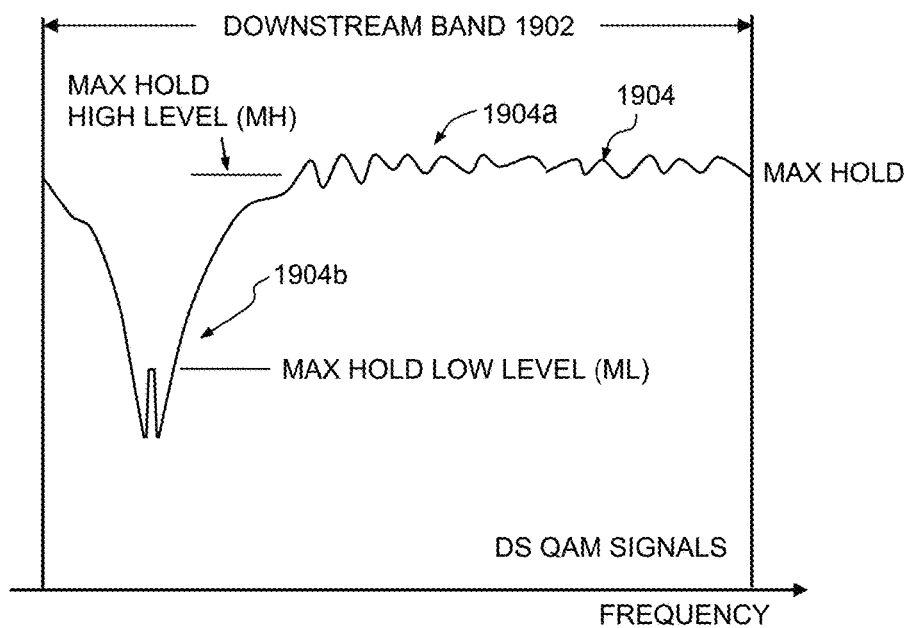
FIG. 19 is a diagram showing Max Hold spectrum of portions of adjacent QAM downstream channel signals, where the Max Hold spectrum is produced by a cable modem from a plurality of captured spectrums of the downstream band (as in FIGS. 18A & 18B), and showing measured quantities used in detecting a PIM distortion product.

With reference to FIG. 19, the description of the PIM detection process (for the third embodiment) continues. In one example, the cable modem has performed 100 spectrum captures over a span of time that overlaps a number of active and quiet intervals. Each capture includes a band spectrum (e.g., 1804a or 1804b) contained in a downstream band (e.g., 1802). In FIG. 19, a downstream band 1902 contains a Max Hold spectrum 1904, which was generated by the cable modem from the 100 captured spectrums. As demonstrated by a comparison of FIGS. 18A/18B and 19, Max Hold spectrum 1904 substantially maintains the high and low regions (1806' and 1811) of downstream signal spectrum 1806. This is so because the captured spectrums are predominately downstream signal spectrums 1806 (compare FIG. 18A with FIG. 18B). In FIG. 19, Max Hold spectrum 1904 has a high region 1904a and a low region 1904b. High region 1904a corresponds to the top of the haystack of one QAM channel signal and low region 1904b corresponds to the guard band or roll-off region between two QAM channel signals.

Again referring to FIG. 19, the level at Max Hold high region 1904a is MH and the level at Max Hold low region 1904b is ML. In one method of the third embodiment, "receive carrier-to-noise ratio" (RxCNR) is the preferred performance metric for indicating a detection of a PIM distortion product. RxCNR is determined generally from the ratio of MH over ML. For example, if the resolution bandwidth of the spectrum analyzer of the cable modem is 30 kHz, then the RxCNR can be estimated from the formula: RxCNR=(MH+14 dB)/ML, where 14 dB is a coefficient for recalculating the Max Hold spectrum at 30 kHz to the actual QAM level. Detection of a PIM distortion product at low region 1904b is indicated if RxCNR is less than a particular threshold value, such as, for example, 30 dB or 25 dB. The third embodiment is not limited this approach to PIM detection, although it is preferred for its simplicity and effectiveness.

Alternative detection procedures may be employed in the third embodiment, such as those discussed with respect to the second embodiment and regarding the parameters described with reference to FIG. 13. For instance, both Max Hold and AVG spectrums may be generated to utilize the High Region Difference (DH) and Low Region Difference (DL) parameters for detection. If DL is greater than DH (DL>DH) by some threshold value (e.g., 6 dB), PIM detection may be indicated. In another detection procedure, other cable modems in the same cable plant may be employed to measure RxCNR and a comparison of RxCNRs may be made between the initial (or local) cable modem and the other cable modems. In the latter procedure, if the initial RxCNR is less than the highest RxCNR of the other cable modems ("highest RxCNR") by some threshold value (e.g., 3 dB, 4 dB, 5 dB, or 6 dB), a detection of PIM distortion may be indicated.

Figure 20:
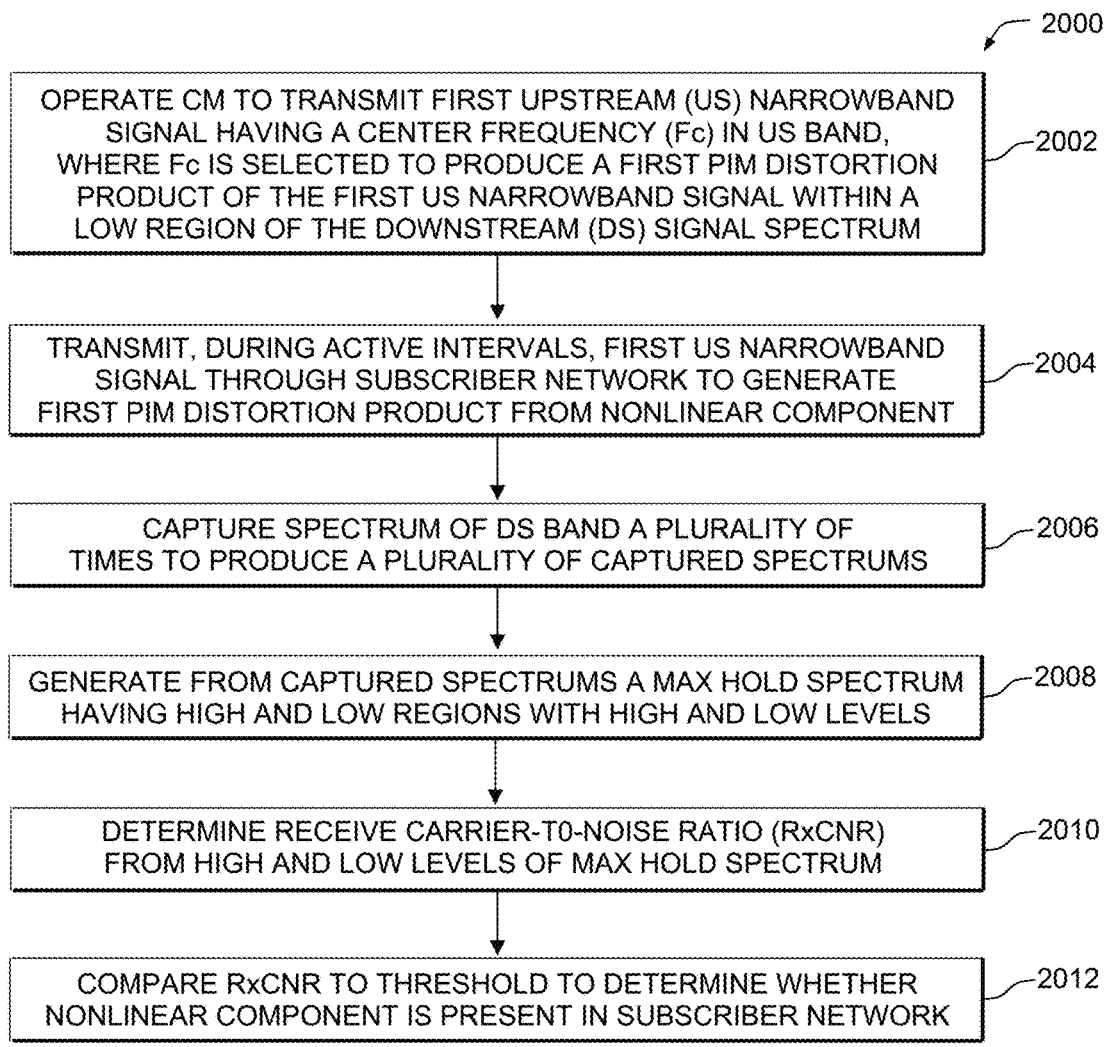
FIG. 20 is a flow diagram outlining a first method of a third embodiment of the invention, where a narrowband signal is transmitted in an upstream band by a cable modem to produce PIM distortion in a downstream band, for purposes of determining the presence of a nonlinear component in a subscriber network associated with the cable modem.

Referring now to FIG. 20, a flow diagram outlines a method 2000 of the third embodiment. Method 2000 determines the presence of a nonlinear component in a subscriber network coupled between a cable plant and a cable modem (see, e.g., FIG. 3). The cable modem receives a downstream signal (e.g., signal 1808), in a downstream band (e.g., band 1802), from the cable plant via the subscriber network. The downstream signal has a downstream signal spectrum (e.g., spectrum 1806) characterized by high and low regions (e.g., regions 1806' and 1811). As outlined in FIG. 20, method 2000 comprises several steps. In a step 2002, the cable modem is operated to transmit a first narrowband signal having a first center frequency (F1) in an upstream band (e.g., signal 1706 in FIG. 17). The first center frequency is selected to produce a first PIM distortion product (e.g., PIM product 1710) of the first narrowband signal within the low region of the downstream signal spectrum (FIGS. 17 & 18B). In a step 2004, the first narrowband signal is transmitted, during active intervals, to the cable plant, via the subscriber network, to generate the first PIM distortion product from an interaction between the first narrowband signal and the nonlinear component in the subscriber network. The downstream band (e.g., band 1802) contains a spectrum that includes: (1) the downstream signal spectrum (e.g., spectrum 1806) and a spectrum of the first PIM distortion product (e.g., spectrum 1807) during the active intervals (FIG. 18B); and (2) the downstream signal spectrum and not the spectrum of the first PIM distortion product during periods when the first narrowband signal is not transmitted (FIG. 18A). In a step 2006, the spectrum of the downstream band (e.g., 1804a, 1804b) is captured, at the cable modem, a plurality of times to produce a plurality of captured spectrums. In a step 2008, a Max Hold spectrum (e.g., spectrum 1904) is generated, at the cable modem, from the plurality of captured spectrums (FIG. 19). The Max Hold spectrum substantially maintains the high and the low regions of the downstream signal spectrum and has high and low levels (MH & ML) at the high and the low regions (e.g., 1904a & 1904b), respectively. In a step 2010, a value of a first performance metric (e.g., RxCNR) is determined from the high and the low levels of the Max Hold spectrum. Lastly, in a step 2012, the value of the first performance metric (RxCNR) is compared to a first threshold value (e.g., 25 or 30 dB), to determine whether the first PIM distortion product has been detected and whether the nonlinear component is present in the subscriber network. Alternatively, the first threshold value in step 2012 may be based on the highest RxCNR value determined among a plurality of other cable modems coupled to the cable plant via a plurality of other subscriber networks, respectively (as in the second embodiment).

In a modification of method 2000, the downstream signal spectrum has a second high region and a second low region (in addition to the original high and low regions). In this modification, the first center frequency (e.g., F1 in FIG. 17) of the first narrowband signal is selected in step 2002 to produce a second PIM distortion product (in addition to the first PIM product) of the first narrowband signal within the second low region of the downstream signal spectrum (see multiple high and low regions of a downstream signal spectrum in FIG. 17). In step 2004, when the first narrowband signal (e.g., signal 1706—F1) is transmitted through the subscriber network, the second PIM distortion product (e.g., PIM product 1712) is generated from an interaction between the first narrowband signal and the nonlinear component in the subscriber network. In this case, the spectrum of the downstream band includes: (1) the downstream signal spectrum, the spectrum of the first PIM distortion product, and a spectrum of the second PIM distortion product during active intervals; and (2) the downstream signal spectrum and not the spectrums of the first and the second PIM distortion products during periods when the first narrowband signal is not transmitted. In step 2008 of the modified method, the Max Hold spectrum substantially maintains the second high and second low regions of the downstream signal spectrum (in addition to maintaining the original high and low regions of the downstream signal spectrum). The Max Hold spectrum has second high and second low levels at the second high and second low regions, respectively. In step 2010 of the modified method, a value of a second performance metric (e.g., RxCNR) from the second high and the second low levels of the Max Hold spectrum is determined. And, in step 2012 of the modified method, the value of the second performance metric is compared to a second threshold value, to determine whether the second PIM product has been detected and whether the nonlinear component is present in the subscriber network.

Figure 21:
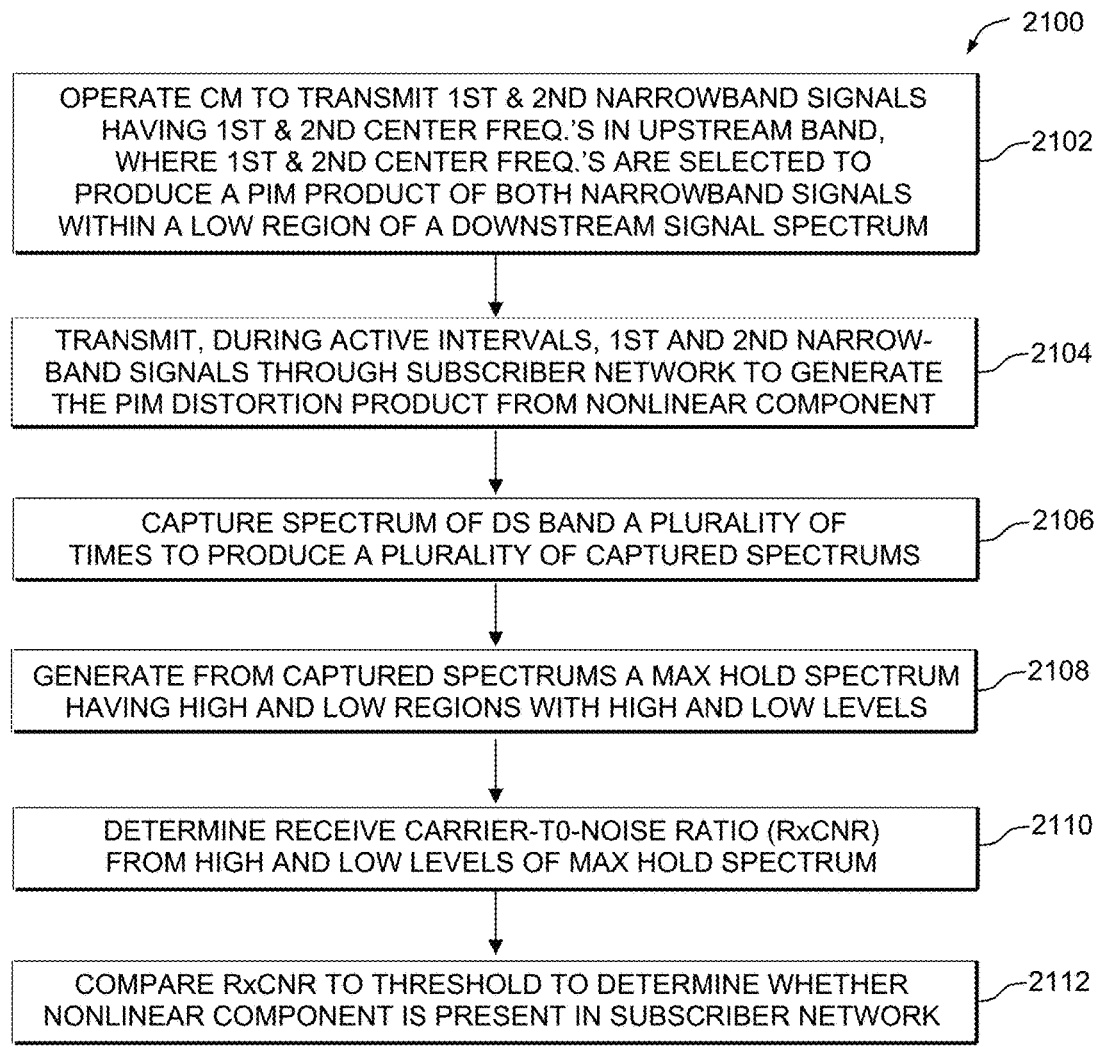
FIG. 21 is a flow diagram outlining a second method of the third embodiment of the invention, where two narrowband signals are transmitted in the upstream band by a cable modem to produce PIM distortion from both narrowband signals in the downstream band, for determining the presence of a nonlinear component in a subscriber network associated with the cable modem.

Referring now to FIG. 21, a flow diagram outlines a method 2100 of the third embodiment. Method 2100 determines the presence of a nonlinear component in a subscriber network coupled between a cable plant and a cable modem. Method 2100 is similar to method 2000, except two upstream narrowband signals are employed. As outlined in FIG. 21, method 2100 comprises several steps. In a step 2102, the cable modem is operated to transmit, in an upstream band, first and second narrowband signals having first and second center frequencies, respectively (see, e.g., FIG. 17, signal 1706—F1 & F2). The first and second center frequencies (e.g., F1 & F2) are selected to produce a PIM distortion product of both narrowband signals (e.g., PIM product 1718) within the low region of the downstream signal spectrum (e.g., QAM channel signal 1720). In a step 2104, the first and second narrowband signals are transmitted during active intervals through the subscriber network to generate the PIM distortion product. The PIM product is generated from an interaction between the narrowband signals and the nonlinear component in the subscriber network. The downstream band contains a spectrum that includes: (1) the downstream signal spectrum and a spectrum of the PIM distortion product during active intervals (FIG. 18B); and (2) the downstream signal spectrum and not the spectrum of the PIM distortion product during periods when the narrowband signals are not transmitted (FIG. 18A). In a step 2106, the spectrum of the downstream band is captured, at the cable modem, a plurality of times to produce a plurality of captured spectrums. In a step 2108, a Max Hold spectrum is generated, at the cable modem, from the plurality of captured spectrums (FIG. 19). The Max Hold spectrum substantially maintains the high and low regions of the downstream signal spectrum and has high and low levels (MH & ML) at the high and low regions (e.g., 1904a & 1904b) respectively. In a step 2110, a value of a performance metric (e.g., RxCNR) is determined from the high and low levels of the Max Hold spectrum. In a step 2112, the value of the performance metric is compared to a threshold value (e.g., 25 or 30 dB) to determine whether the PIM distortion product has been detected and whether the nonlinear component is present in the subscriber network. Again, it is preferred that the narrowband signals be CW signals (e.g., at F1 & F2). In such case, the PIM product may be a third order difference product having a frequency equal to, e.g., 2F2-F1.

Methods 2000 and 2100 may be combined such that a first narrowband signal may be selected to produce, e.g., one or two PIM distortion products (e.g., second and/or third harmonics), and a second upstream narrowband signal selected to interact with the first narrowband signal (at a nonlinear component) to produce a PIM distortion product that is a function of both first and second narrowband signals (e.g., difference product 2F2-F1). Thus, the combined method may produce both types of PIM distortion, harmonic (e.g., 2F1, 3F1, etc.) and difference (2F2-F1), as illustrated in FIG. 17. In the combined method, the detection of one type of PIM distortion product may be confirmed or validated by the detection of another type of PIM distortion product.

In methods 2000 and 2100, the spectrum captures carried out at the cable modem may be synchronized to the active intervals. In such case, each captured spectrum contains the downstream signal spectrum and the spectrum of the PIM distortion product or products ("synced captured spectrum"). The synced captured spectrums are used to generate the Max Hold spectrum, from which parameters MH and ML are obtained for detection (FIG. 19).

In the methods of the first embodiment of the invention (e.g., FIGS. 9A & 10A), the steps of receiving the downstream signal during active and quiet intervals and measuring a performance metric (e.g., RxMER) of the downstream signal, are preferably performed by a cable modem. One or more of the other steps of these methods may be performed by the CMTS, PNM server, cable modem, or other suitable device. Similarly, in the methods of the second embodiment (e.g., FIGS. 20 & 16), the steps of capturing the spectrums of the downstream band and generating Max Hold and AVG spectrums from the captured spectrums are performed by the cable modem. One or more of the other steps of these methods may be performed by the CMTS, PNM server, cable modem, or other suitable device. Lastly, with respect to the third embodiment (FIGS. 17-21), all of the method or operational steps may be performed, at least in part, by a cable modem; however, the steps of determining a value for a performance metric (e.g., RxCNR) and comparing the performance metric value to a threshold value may be performed by a PNM server or any other suitable device.

The term "cable modem," as used throughout this description and in the claims, is intended to include a cable modem or any other DOCSIS-capable device configured to carryout steps of the claimed methods. For example, the term "cable modem" may include a suitably configured digital set-top-box (d-STB), smart TV, terminal device, remote physical layer (R-PHY) module, cable gateway, or other suitably configured communication or network device.

The various functions of the present invention, as described above, may be implemented in hardware, firmware, software, or a combination of these. For example, with respect to hardware, these functions may be implemented in an application specific integrated circuit (ASIC), digital signal processor (DSP), field programmable gate array (FPGA), system on a chip (SoC), micro-controller, microprocessor, programmable logic device, general purpose computer, special purpose computer, other electronic device, or a combination of these devices (hereinafter "processor"). If the various functions are implemented in firmware, software, or other computer-executable instructions, then they may be stored on any suitable computer-readable media. Computer-executable instructions may cause a processor or other device to perform the aforementioned functions of the present invention. Computer-executable instructions include data structures, objects, programs, routines, or other program modules accessible and executable by a processor. The computer-readable media may be any available media accessable by a processor. Embodiments of the present invention may include one or more computer-readable media. Generally, computer-readable media include, but are not limited to, random-access memory ("RAM), read-only memory ("ROM), programmable read-only memory ("PROM), erasable programmable read-only memory ("EPROM), electrically erasable programmable read-only memory ("EEPROM"), compact disk read-only memory ("CD-ROM), or any other device or component that is capable of providing data or executable instructions accessible by a processor. Certain embodiments recited in the claims may be limited to the use of tangible, non-transitory computer-readable media, and the phrases "tangible computer-readable medium" and "non-transitory computer-readable medium" (or plural variations) used herein are intended to exclude transitory propagating signals per se.

While the preferred embodiments of the invention have been particularly described in the specification and illustrated in the drawing, it should be understood that the invention is not so limited. Many modifications, equivalents and adaptations of the invention will become apparent to those skilled in the art without departing from the spirit and scope of the invention, as defined in the appended claims.

What is claimed is:

1. A method of using a cable modem in the detection of passive intermodulation (PIM) distortion affecting a downstream signal, the cable modem receiving the downstream signal from a cable plant via a subscriber network and transmitting an upstream signal to the cable plant via the subscriber network, the upstream signal being transmitted in bursts during active intervals and not being transmitted during quiet intervals, the PIM distortion arising from an interaction between the upstream signal and a nonlinear component in the subscriber network and occurring in bursts that substantially correspond to transmissions of the upstream signal during the active intervals, said method comprising the steps of:

(a) receiving, at the cable modem, the downstream signal substantially during one of the active intervals, the downstream signal being pre-identified from a relationship between the PIM distortion and the upstream signal;

(b) measuring a performance metric of the downstream signal received in step (a), to obtain an active measured value;

(c) receiving, at the cable modem, the downstream signal substantially during one of the quiet intervals;

(d) measuring the performance metric of the downstream signal received in step (c), to obtain a quiet measured value;

(e) comparing the active measured value with the quiet measured value; and (f) determining whether PIM distortion has been detected based on the comparison performed in step (e).

2. The method of claim 1, wherein step (e) includes determining a performance difference between the active measured value and the quiet measured value, and wherein step (f) includes comparing the performance difference to a threshold value and determining whether the PIM distortion has been detected based on the comparison to the threshold value.

3. The method of claim 2, wherein steps (a) through (e) are performed a plurality of times to obtain a plurality of performance differences, said method further comprising the step of determining an average difference of the plurality of performance differences, and wherein step (f) includes comparing the average difference to the threshold value, the determination of whether the PIM distortion has been detected being based on the comparison of the average difference to the threshold value.

4. The method of claim 2, wherein steps (b) and (d) are performed by the cable modem.

5. The method of claim 2, wherein the performance metric is receive modulation error ratio (RxMER), and wherein step (b) includes measuring the RxMER of the downstream signal received in step (a) and step (d) includes measuring the RxMER of the downstream signal received in step (c).

6. The method of claim 5, wherein the downstream signal is contained within a downstream channel.

7. A method of using a cable modem in the detection of first and second passive intermodulation (PIM) distortion products affecting first and second downstream signals, respectively, the cable modem receiving the first and the second downstream signals from a cable plant via a subscriber network and transmitting an upstream signal to the cable plant via the subscriber network, the upstream signal being transmitted in bursts during active intervals and not being transmitted during quiet intervals, the first and the second PIM distortion products arising from an interaction between the upstream signal and a nonlinear component in the subscriber network and occurring in bursts that substantially correspond to transmissions of the upstream signal during the active intervals, said method comprising the steps of:

(a) receiving, at the cable modem, the first and the second downstream signals substantially during one of the active intervals, the first and the second downstream signals being pre-identified from a relationship between the first and the second PIM distortion products and the upstream signal;

(b) measuring a first performance metric of the first downstream signal received in step (a) to obtain a first active measured value, and measuring a second performance metric of the second downstream signal received in step (a) to obtain a second active measured value;

(c) receiving, at the cable modem, the first and the second downstream signals substantially during one of the quiet intervals;

(d) measuring the first performance metric of the first downstream signal received in step (c) to obtain a first quiet measured value, and measuring the second performance metric of the second downstream signal received in step (c) to obtain a second quiet measured value;

(e) determining a first performance difference between the first active and the first quiet measured values, and determining a second performance difference between the second active and the second quiet measured values;

(f) comparing the first performance difference to a first threshold value and the second performance difference to a second threshold value; and (g) determining whether the first and the second PIM distortion products have been detected, based on the comparisons performed in step (f).

8. The method of claim 7, wherein the first PIM distortion product is of a second order and the second PIM distortion product is of a third order.

9. The method of claim 7, wherein steps (a) through (e) are performed a plurality of times to obtain a plurality of first performance differences and a plurality of second performance differences, said method further comprising the step of determining a first average difference of the plurality of first performance differences and a second average difference of the plurality of second performance differences, and wherein step (f) includes comparing the first average difference to the first threshold value and the second average difference to the second threshold value, and step (g) includes determining whether the first and the second PIM distortion products have been detected, based on the comparisons of the first average difference to the first threshold value and the second average difference to the second threshold value.

10. The method of claim 7, wherein steps (b) and (d) are performed by the cable modem.

11. The method of claim 7, wherein the first and the second performance metrics are each receive modulation error ratio (RxMER), and wherein step (b) includes measuring the RxMER of the first and the second downstream signals received in step (a) and step (d) includes measuring the RxMER of the first and the second downstream signals received in step (c).

12. The method of claim 7, wherein the first and the second downstream signals are contained within first and second downstream channels, respectively.

13. A non-transitory machine-readable medium storing computer program instructions, which, when executed by at least one processor, carry out operations involving a cable modem in the detection of passive intermodulation (PIM) distortion affecting a downstream signal, the cable modem receiving the downstream signal from a cable plant via a subscriber network and transmitting an upstream signal to the cable plant via the subscriber network, the upstream signal being transmitted in bursts during active intervals and not being transmitted during quiet intervals, the PIM distortion arising from an interaction between the upstream signal and a nonlinear component in the subscriber network and occurring in bursts that substantially correspond to the transmissions of the upstream signal during the active intervals, the operations comprise:
  (a) receiving, at the cable modem, the downstream signal substantially during one of the active intervals, the downstream signal being pre-identified from on a relationship between the PIM distortion and the upstream signal;
  (b) measuring a performance metric of the downstream signal received in step (a), to obtain an active measured value;
  (c) receiving, at the cable modem, the downstream signal substantially during one of the qui et intervals;
  (d) measuring the performance metric of the downstream signal received in step (c), to obtain a quiet measured value;
  (e) comparing the active measured value with the quiet measured value; and
  (f) determining whether PIM distortion has been detected based on the comparison performed in step (e).

14. A method of using a cable modem in the detection of passive intermodulation (PIM) distortion affecting a downstream signal in a downstream band,
  the cable modem receiving the downstream signal from a cable plant via a subscriber network and transmitting an upstream signal to the cable plant via the subscriber network,
  the upstream signal being transmitted in bursts during active intervals and not being transmitted during quiet intervals,
  the PIM distortion arising from an interaction between the upstream signal and a nonlinear component in the subscriber network and occurring in bursts that substantially correspond to transmissions of the upstream signal during the active intervals,
  the downstream signal having a downstream signal spectrum with high and low regions and the PIM distortion having a PIM spectrum overlapping the low region of the downstream signal spectrum,
  the downstream band containing a spectrum that includes the downstream signal spectrum and does not include the PIM spectrum during quiet intervals and includes the downstream signal spectrum and the PIM spectrum during active intervals, said method comprising the steps of:
  (a) capturing, at the cable modem, the spectrum of the downstream band a plurality of times to produce a plurality of captured spectrums, the plurality of captured spectrums being captured during some of the active intervals and some of the quiet intervals, the downstream band being pre-identified from a relationship between the PIM distortion and the upstream signal;
  (b) generating, at the cable modem, maximum hold and averaged spectrums from the plurality of captured spectrums, the maximum hold and the averaged spectrums substantially maintaining the high and the low regions of the downstream signal spectrum;
  (c) determining a difference in level between the maximum hold spectrum and the averaged spectrum at the high and the low regions, to produce a high region difference and a low region difference; and
  (d) determining whether the PIM distortion has been detected based on a comparison between the high region difference and the low region difference.

15. The method of claim 14, wherein step (d) includes determining that the PIM distortion has been detected if the low region difference is greater than the high region difference.

16. The method of claim 14, wherein step (d) includes determining that the PIM distortion has been detected if the low region difference is greater than the high region difference by a threshold value.

17. The method of claim 14, wherein steps (c) and (d) are performed by the cable modem.

18. The method of claim 14, wherein the maximum hold spectrum has high and low signal level values at the high and the low regions, respectively, and wherein said method further comprises the step of
  (e) determining a first receive carrier-to-noise ratio (RxCNR) value from the high and the low signal level values.

19. The method of claim 18, wherein:
  the upstream signal has a first upstream spectrum;
  a plurality of other cable modems are coupled to the cable plant via a plurality of other subscriber networks, respectively, each of the other cable modems receiving the downstream signal from the cable plant and transmitting another upstream signal to the cable plant, the other upstream signal being transmitted in bursts during assigned active intervals and not being transmitted during quiet intervals, the other upstream signal having a spectrum that is substantially the same as the first upstream spectrum;
  step (a) is repeated and a maximum hold spectrum is generated at each of the other cable modems; and
  said method further comprises the steps of
  (f) determining, as in step (e), a RxCNR value at each of the other cable modems, and
  (g) comparing the highest RxCNR value determined among the other cable modems to the first RxCNR value, to aid in the determination of step (d).

20. The method of claim 19, wherein step (g) includes determining that the PIM distortion has been detected if the first RxCNR value is less than the highest RxCNR value among the other cable modems.

21. The method of claim 19, wherein step (g) includes determining that the PIM distortion has been detected if the first RxCNR value is less than the highest RxCNR value among the other cable modems by a threshold value.

22. The method of claim 14, wherein the low region of the downstream signal spectrum is a guard band or roll-off region defined between the spectrums of two adjacent channel signals, and wherein the high region of the downstream signal spectrum is a maximal portion of either of the spectrums of the two adjacent channel signals.

23. A method of using a first cable modem in the detection of passive intermodulation (PIM) distortion affecting a downstream signal in a downstream band,
- the first cable modem receiving the downstream signal from a cable plant via a subscriber network and transmitting a first upstream signal, in an upstream band, to the cable plant via the subscriber network,
- the first upstream signal being transmitted in bursts during active intervals and not being transmitted during quiet intervals,
- the PIM distortion arising from an interaction between the first upstream signal and a nonlinear component in the subscriber network and occurring in bursts that correspond to transmissions of the first upstream signal during the active intervals,
- the downstream signal having a downstream signal spectrum with high and low regions, the first upstream signal having a first upstream spectrum, and the PIM distortion having a PIM spectrum that overlaps at least the low region of the downstream signal spectrum,
- the downstream band containing a spectrum that includes the downstream signal spectrum and does not include the PIM spectrum during quiet intervals and includes the downstream signal spectrum and the PIM spectrum during active intervals,
- said method further employing a plurality of other cable modems coupled to the cable plant via a plurality of other subscriber networks, respectively, each of the other cable modems receiving the downstream signal from the cable plant and transmitting to the cable plant, at assigned active intervals, an upstream signal having substantially the first upstream spectrum in the upstream band, and each of the other cable modems not transmitting during quiet periods, said method comprising the steps of:
- (a) capturing, at the first cable modem, the spectrum of the downstream band a plurality of times to produce a plurality of captured spectrums, the plurality of captured spectrums being captured during some of the active intervals and some of the quiet intervals, the downstream band being pre-identified from on a relationship between the PIM spectrum and the first upstream spectrum;
- (b) generating, at the first cable modem, a maximum hold spectrum from the plurality of captured spectrums, the maximum hold spectrum substantially maintaining the high and the low regions of the downstream signal spectrum and having high and low signal levels at the high and the low regions, respectively;
- (c) determining a first receive carrier-to-noise ratio (RxCNR) value from the high and the low signal levels of the maximum hold spectrum;
- (d) repeating steps (a) through (c) for each of the other cable modems to determine a RxCNR value at each of the other cable modems; and
- (e) comparing the first RxCNR value to the highest RxCNR value determined among the other cable modems, to determine whether the PIM distortion has been detected.

24. The method of claim 23, wherein step (e) includes determining that the PIM distortion has been detected if the first RxCNR value is less than the highest RxCNR value among the other cable modems.

25. The method of claim 23, wherein step (e) includes determining that the PIM distortion has been detected if the first RxCNR value is less than the highest RxCNR value among the other cable modems by a threshold value.

26. A method of determining the presence of a nonlinear component in a subscriber network coupled between a cable plant and a cable modem, the cable modem receiving a downstream signal, in a downstream band, from the cable plant via the subscriber network, the downstream signal having a downstream signal spectrum characterized by high and low regions, said method comprising the steps of:
- (a) operating the cable modem to transmit a first narrowband signal having a first center frequency in an upstream band, the first center frequency being selected to produce a first passive intermodulation (PIM) distortion product of the first narrowband signal substantially within the low region of the downstream signal spectrum;
- (b) transmitting, during active intervals, the first narrowband signal to the cable plant, via the subscriber network, to generate the first PIM distortion product from an interaction between the first narrowband signal and the nonlinear component in the subscriber network, the downstream band containing a spectrum that includes the downstream signal spectrum and a spectrum of the first PIM distortion product during the active intervals and includes the downstream signal spectrum and does not include the spectrum of the first PIM distortion product during periods when the first narrowband signal is not transmitted;
- (c) capturing, at the cable modem, the spectrum of the downstream band a plurality of times to produce a plurality of captured spectrums;
- (d) generating, at the cable modem, a maximum hold spectrum from the plurality of captured spectrums, the maximum hold spectrum substantially maintaining the high and the low regions of the downstream signal spectrum and having high and low levels at the high and the low regions, respectively;
- (e) determining a value of a first performance metric from the high and the low levels of the maximum hold spectrum; and
- (f) comparing the value of the first performance metric to a first threshold value to determine whether the first PIM distortion product has been detected and whether the nonlinear component is present in the subscriber network.

27. The method of claim 26, wherein the first performance metric is receive carrier-to-noise ratio (RxCNR).

28. The method of claim 27, wherein the first threshold value is based on the highest RxCNR value determined among a plurality of other cable modems coupled to the cable plant via a plurality of other subscriber networks, respectively.

29. The method of claim 26, wherein the downstream signal includes a downstream channel signal, and wherein the low region of the downstream signal spectrum is a guard band or roll-off region associated with the downstream channel signal.

30. The method of claim 26, wherein the downstream signal includes a pair of adjacent downstream channel signals, and wherein the low region of the downstream signal spectrum is a guard band or roll-off region between the pair of adjacent downstream channel signals.

31. The method of claim 26, wherein the first narrowband signal is a continuous wave (CW) signal having a single frequency, the first center frequency of the first narrowband signal being the single frequency; and wherein steps (a) and (b) are performed in connection with the CW signal.

32. The method of claim 31, wherein the first PIM distortion product is a harmonic of the CW signal, the harmonic having a frequency that is a multiple of the single frequency of the CW signal.

33. The method of claim 26, wherein:
the downstream signal spectrum is further characterized by second high and second low regions;
the first center frequency of the first narrowband signal is selected to produce a second PIM distortion product of the first narrowband signal substantially within the second low region of the downstream signal spectrum;
step (b) includes generating the second PIM distortion product from an interaction between the first narrowband signal and the nonlinear component in the subscriber network, the spectrum of the downstream band including the downstream signal spectrum, the spectrum of the first PIM distortion product, and a spectrum of the second PIM distortion product during the active intervals, and including the downstream signal spectrum and not including the spectrums of the first and the second PIM distortion products during the periods when the first narrowband signal is not transmitted;
the maximum hold spectrum substantially maintains the second high and the second low regions of the downstream signal spectrum and has second high and second low levels at the second high and the second low regions, respectively;
step (e) includes determining a value of a second performance metric from the second high and the second low levels of the maximum hold spectrum; and
step (f) includes comparing the value of the second performance metric to a second threshold value to determine whether the second PIM distortion product has been detected and whether the nonlinear component is present in the subscriber network.

34. The method of claim 33, wherein the second performance metric is receive carrier-to-noise ratio (RxCNR).

35. The method of claim 33, wherein the first narrowband signal is a continuous wave (CW) signal having a single frequency, the first center frequency of the first narrowband signal being the single frequency; and wherein steps (a) and (b) are performed in connection with the CW signal.

36. The method of claim 35, wherein the first PIM distortion product is the second harmonic of the CW signal and the second PIM distortion product is the third harmonic of the CW signal.

37. The method of claim 26, wherein:
the downstream signal spectrum is further characterized by second high and second low regions;
step (a) includes operating the cable modem to transmit a second narrowband signal with the first narrowband signal, the second narrowband signal having a second center frequency in the upstream band and separated from the first center frequency of the first narrowband signal, the second center frequency being selected to produce a second PIM distortion product of both the first and the second narrowband signals substantially within the second low region of the downstream signal spectrum;
step (b) includes transmitting, during the active intervals, the second narrowband signal with the first narrowband signal, to generate the second PIM distortion product from an interaction between the first and the second narrowband signals and the nonlinear component in the subscriber network, the spectrum of the downstream band including the downstream signal spectrum, the spectrum of the first PIM distortion product, and a spectrum of the second PIM distortion product during the active intervals, and including the downstream signal spectrum and not including the spectrums of the first and the second PIM distortion products during periods when the first and the second narrowband signals are not transmitted;
the maximum hold spectrum substantially maintains the second high and the second low regions of the downstream signal spectrum and has second high and second low levels at the second high and the second low regions, respectively;
step (e) includes determining a value of a second performance metric from the second high and the second low levels of the maximum hold spectrum; and
step (f) includes comparing the value of the second performance metric to a second threshold value to determine whether the second PIM distortion product has been detected and whether the nonlinear component is present in the subscriber network.

38. A method of determining the presence of a nonlinear component in a subscriber network coupled between a cable plant and a cable modem, the cable modem receiving a downstream signal, in a downstream band, from the cable plant via the subscriber network, the downstream signal having a downstream signal spectrum characterized by high and low regions, said method comprising the steps of:
(a) operating the cable modem to transmit, in an upstream band, first and second narrowband signals having first and second center frequencies, respectively, the first and the second center frequencies being selected to produce a passive intermodulation (PIM) distortion product of both the first and the second narrowband signals substantially within the low region of the downstream signal spectrum;
(b) transmitting, during active intervals, the first and the second narrowband signals to the cable plant, via the subscriber network, to generate the PIM distortion product from an interaction between the first and the second narrowband signals and the nonlinear component in the subscriber network, the downstream band containing a spectrum that includes the downstream signal spectrum and a spectrum of the PIM distortion product during the active intervals and includes the downstream signal spectrum and does not include the spectrum of the PIM distortion product during periods when the first and the second narrowband signals are not transmitted;
(c) capturing, at the cable modem, the spectrum of the downstream band a plurality of times to produce a plurality of captured spectrums;
(d) generating, at the cable modem, a maximum hold spectrum from the plurality of captured spectrums, the maximum hold spectrum substantially maintaining the high and the low regions of the downstream signal spectrum and having high and low levels at the high and the low regions, respectively;
(e) determining a value of a performance metric from the high and the low levels of the maximum hold spectrum; and
(f) comparing the value of the performance metric to a threshold value to determine whether the PIM distortion product has been detected and whether the nonlinear component is present in the subscriber network.

39. The method of claim 38, wherein the performance metric is receive carrier-to-noise ratio (RxCNR).

40. The method of claim 38, wherein the first and the second narrowband signals are continuous wave signals having frequencies F1 and F2, respectively, and wherein the PIM distortion product is a third order product having a frequency related to frequencies F1 and F2.

41. The method of claim 38, wherein the first and the second narrowband signals are continuous wave signals having frequencies F1 and F2, respectively, and wherein the PIM distortion product is a third order difference product having a frequency equal to 2F2-F1.

42. A non-transitory machine-readable medium storing computer program instructions, which, when executed by at least one processor, carry out operations for determining the presence of a nonlinear component in a subscriber network coupled between a cable plant and a cable modem, the cable modem receiving a downstream signal, in a downstream band, from the cable plant via the subscriber network, the downstream signal having a downstream signal spectrum characterized by high and low regions, the operations comprise:

(a) operating the cable modem to transmit a first narrowband signal having a first center frequency in an upstream band, the first center frequency being selected to produce a passive intermodulation (PIM) distortion product of the first narrowband signal substantially within the low region of the downstream signal spectrum;

(b) transmitting, during active intervals, the first narrowband signal to the cable plant, via the subscriber network, to generate the PIM distortion product from an interaction between the first narrowband signal and the nonlinear component in the subscriber network, the downstream band containing a spectrum that includes the downstream signal spectrum and a spectrum of the PIM distortion product during the active intervals and includes the downstream signal spectrum and does not include the spectrum of the PIM distortion product during periods when the first narrowband signal is not transmitted;

(c) capturing, at the cable modem, the spectrum of the downstream band a plurality of times to produce a plurality of captured spectrums;

(d) generating, at the cable modem, a maximum hold spectrum from the plurality of captured spectrums, the maximum hold spectrum substantially maintaining the high and the low regions of the downstream signal spectrum and having high and low levels at the high and the low regions, respectively;

(e) determining a value of a performance metric from the high and the low levels of the maximum hold spectrum; and (f) comparing the value of the performance metric to a threshold value to determine whether the PIM distortion product has been detected and whether the nonlinear component is present in the subscriber network.

43. The non-transitory machine-readable medium of claim 42, wherein the performance metric is receive carrier-to-noise ratio (RxCNR).

44. A method of determining the presence of a nonlinear component in a subscriber network coupled between a cable plant and a cable modem, the cable modem receiving a downstream signal, in a downstream band, from the cable plant via the subscriber network, the downstream signal having a downstream signal spectrum characterized by high and low regions, said method comprising the steps of:

(a) operating the cable modem to transmit a narrowband signal having a center frequency in an upstream band, the center frequency being selected to produce a passive intermodulation (PIM) distortion product of the narrowband signal substantially within the low region of the downstream signal spectrum;

(b) transmitting, during active intervals, the narrowband signal to the cable plant, via the subscriber network, to generate the PIM distortion product from an interaction between the narrowband signal and the nonlinear component in the subscriber network, the downstream band containing a spectrum that includes the downstream signal spectrum and a spectrum of the PIM distortion product during the active intervals;

(c) capturing, at the cable modem, the spectrum of the downstream band in synchronism with one of the active intervals, to produce a synced captured spectrum;

(d) repeating step (c) a plurality of times to produce a plurality of synced captured spectrums;

(e) generating, at the cable modem, a maximum hold spectrum from the plurality of synced captured spectrums, the maximum hold spectrum having first and second regions substantially corresponding to the high and the low regions of the downstream signal spectrum, respectively, and having high and low levels at the first and the second regions, respectively;

(f) determining a value of a first performance metric from the high and the low levels of the maximum hold spectrum; and (g) comparing the value of the first performance metric to a first threshold value to determine whether the PIM distortion product has been detected and whether the nonlinear component is present in the subscriber network.

* * * * *